United States Patent
Kidwell, Jr. et al.

(10) Patent No.: US 10,722,918 B2
(45) Date of Patent: Jul. 28, 2020

(54) RELEASE HOLE PLUS CONTACT VIA FOR FINE PITCH ULTRASOUND TRANSDUCER INTEGRATION

(71) Applicant: QUALCOMM Incorporated, San Diego, CA (US)

(72) Inventors: Donald William Kidwell, Jr., Los Gatos, CA (US); Ravindra Shenoy, Dublin, CA (US); Jon Lasiter, Stockton, CA (US)

(73) Assignee: QUALCOMM Incorporated, San Diego, CA (US)

( * ) Notice: Subject to any disclaimer, the term of this patent is extended or adjusted under 35 U.S.C. 154(b) by 720 days.

(21) Appl. No.: 15/254,593

(22) Filed: Sep. 1, 2016

(65) Prior Publication Data

US 2017/0066014 A1    Mar. 9, 2017

Related U.S. Application Data

(60) Provisional application No. 62/214,020, filed on Sep. 3, 2015.

(51) Int. Cl.
*B81B 7/04*    (2006.01)
*H01L 41/332*    (2013.01)
(Continued)

(52) U.S. Cl.
CPC .......... *B06B 1/0292* (2013.01); *B06B 1/0622* (2013.01); *B81B 3/0021* (2013.01);
(Continued)

(58) Field of Classification Search
CPC ............................ B06B 1/0292; B06B 1/0622
(Continued)

(56) References Cited

U.S. PATENT DOCUMENTS

| 7,790,490 B2 * | 9/2010 | Caliano ................. B06B 1/0292 257/E21.214 |
| 2008/0089179 A1 * | 4/2008 | Matsumoto ................ A61B 8/12 367/140 |

(Continued)

FOREIGN PATENT DOCUMENTS

| CN | 1494875 A | 5/2004 |
| WO | 2015043989 A1 | 4/2015 |

OTHER PUBLICATIONS

International Search Report and Written Opinion—PCT/US2016/050050—ISA/EPO—dated Nov. 18, 2016.
(Continued)

*Primary Examiner* — Thomas M Dougherty
*Assistant Examiner* — Karen B Addison
(74) *Attorney, Agent, or Firm* — Kilpatrick Townsend & Stockton, LLP

(57) ABSTRACT

Methods, systems, computer-readable media, and apparatuses for high density Micro-Electro-Mechanical Systems (MEMS) are presented. In some embodiments, a method for manufacturing a micro-electro-mechanical device on a substrate can comprise etching a release via through a layer of the device. The method can further comprise creating a cavity in the layer of the device using the release via as a conduit to access the desired location of the cavity, the cavity enabling movement of a transducer of the device. The method can then comprise depositing low impedance, electrically conductive material into the release via to form an electrically conductive path through the layer. Finally, the method can comprise electrically coupling the electrically conductive material to an electrode of the transducer.

14 Claims, 15 Drawing Sheets

(51) Int. Cl.
*B06B 1/02* (2006.01)
*B81C 1/00* (2006.01)
*B81B 3/00* (2006.01)
*B06B 1/06* (2006.01)

(52) U.S. Cl.
CPC .............. *B81B 3/0097* (2013.01); *B81B 7/04* (2013.01); *B81C 1/00134* (2013.01); *B81C 1/00214* (2013.01); *H01L 41/332* (2013.01)

(58) Field of Classification Search
USPC ................ 310/334, 365, 366, 338, 347, 348
See application file for complete search history.

(56) References Cited

U.S. PATENT DOCUMENTS

| | | | |
|---|---|---|---|
| 2008/0212407 A1* | 9/2008 | Caliano | B06B 1/0292 367/140 |
| 2013/0200753 A1 | 8/2013 | Dausch et al. | |
| 2014/0239768 A1 | 8/2014 | Johnson et al. | |
| 2014/0265720 A1 | 9/2014 | El-Gamal et al. | |
| 2015/0008724 A1* | 1/2015 | Wurft | B60B 7/01 301/37.24 |
| 2015/0032002 A1 | 1/2015 | Rothberg et al. | |
| 2015/0165479 A1 | 6/2015 | Lasiter et al. | |
| 2017/0360399 A1* | 12/2017 | Rothberg | A61B 8/4477 |

OTHER PUBLICATIONS

Leirset E. et al.,, "Optical Vibration Measurements of Cross Coupling Effects in Capacitive Micromachined Ultrasonic Transducer Arrays", 2011, 14.

Tanaka S., et al., "Wafer-level Hermetic MEMS Packaging by Anodic Bonding and its Reliability Issues," Microelectronics and Reliability, Mar. 3, 2014 (Mar. 3, 2014), vol. 54(5), pp. 875-881, XP028650154, ISSN: 0026-2714, DOI: 10.1016/J.MICROREL. 2014.02.001 figure 3.

\* cited by examiner

RELEASE HOLE PLUS CONTACT VIA FOR FINE PITCH ULTRASOUND TRANSDUCER INTEGRATION

CROSS-REFERENCE TO RELATED APPLICATIONS

This application claims the benefit of U.S. Provisional Application No. 62/214,020, filed Sep. 3, 2015, entitled "RELEASE HOLE PLUS CONTACT VIA FOR FINE PITCH PMUT INTEGRATION" which is incorporated herein by reference for all purposes.

BACKGROUND

Aspects of the disclosure relate to high density Micro-Electro-Mechanical Systems (MEMS) biometric imaging systems.

Today, mobile devices can be multi-functional devices (e.g., smartphones) that are used for a wide variety of purposes including social interaction, financial transactions, personal healthcare management, work related communications, business dealings, etc. As such, these devices can store and/or display confidential and/or sensitive data. Fingerprint recognition on mobile devices using biometric sensors can provide an enhanced level of device security for a user (e.g., owner) of the mobile device, as it is difficult to duplicate or imitate a user's unique fingerprint data. Additionally, fingerprint readers can offer a level of convenience by enabling quick, secure access to the mobile device through use of biometric information of a user.

As mobile devices are becoming more complex, biometric sensors for mobile devices, including fingerprint sensors, are becoming increasingly miniaturized. A primary driving force towards minimization of biometric sensors is due to popularity of mobile electronic devices such as smart phones. Due to size limitations and the increasing complexity of mobile electronic devices, the available space for each electronic component of the mobile device is generally becoming more limited. Additionally, many mobile electronic devices attempt to combine the functionality of components (such as a button with an integrated biometric sensor), which can further limit space available for biometric sensor(s).

Accordingly, a need exists for improved sensor systems, such as biometric sensor systems, that address ever more demanding space constraints.

BRIEF SUMMARY

Some example techniques are presented herein which may be implemented in various method and apparatuses in a mobile device to possibly provide for or otherwise support enhanced biometric authentication of a user in a mobile device.

In accordance with an example implementation, a method may be provided which can include etching a release via through a layer of the device. The method can also include creating a cavity in the layer of the device using the release via as a conduit to access a desired location of the cavity, the cavity enabling movement of a transducer of the device. The method can further include depositing an electrically conductive material into the release via to form an electrically conductive path through the layer. The method can also include electrically coupling the electrically conductive material to an electrode of the transducer.

The creation of the cavity can comprise etching to sacrificial material of the device and evacuating the sacrificial material via the release via. The etching of the cavity can be performed using a vapor phase etchant. The etching of the release via can extend to an electrically conductive element of the device and the depositing of the electrically conductive material comprises creating an electrically conductive path through the layer to the electrically conductive element, the electrically conductive element differing from the electrode of the transducer. The electrically conductive element can be an element of a redistribution layer of the device. The etching, creating, and depositing can be performed using film deposition techniques.

The substrate can include a substantially planar surface. The release via can be characterized by a first dimension substantially orthogonal to the planar surface and a second dimension substantially parallel to the planar surface. The first dimension can be at least two times greater than the second dimension. The method can further include depositing a piezoelectric material forming at least a portion of the transducer, wherein the etching the release via is performed following the depositing the piezoelectric material forming the at least a portion of the transducer. The method can be used to create a plurality of transducers on a singular substrate and the pitch between transducers of the plurality of transducers is less than fifty microns.

In accordance with yet another example implementation, a mobile device may be provided which includes a layer and a transducer having at least one electrode, the transducer mechanically coupled to the layer. The layer can define at least a portion of a cavity, the cavity configured to enable movement of the transducer. The device can further include a first electrically conductive via that traverses the cavity to form a substantially linear electrically conductive path across the cavity. The first electrically conductive via can be electrically coupled to a first electrode of the at least one electrode of the transducer.

The transducer can be at least partially encapsulated by the layer. The device can further include a redistribution layer and the first electrically conductive via can be configured to provide an electrically conductive coupling between the redistribution layer and the first electrode of the transducer. The device can include a substantially planar side and the substantially linear electrically conductive path of the first electrically conductive via is substantially orthogonal to the planar side. The device can include a planar side. The first electrically conductive via can be characterized by a first dimension substantially orthogonal to the planar side and a second dimension substantially parallel to the planar side. The first dimension can be at least two times greater than the second dimension.

The first electrically conductive via can provide an electrically conductive coupling between two elements of the device on opposing sides of the transducer. The device can include a second electrically conductive via. The first electrode can be further electrically coupled to the second electrically conductive via. The device can include a third electrically conductive via electrically coupled to a second electrode of the at least one transducer.

In accordance with an example implementation, a device may be provided which can include: a plurality of ultrasound transducers arranged on a planar substrate, each transducer having an electrode; a plurality of cavities defined by one or more layers of the substrate configured to enable relative movement between each transducer and the substrate; a plurality of electrically conductive vias each defining at least a portion of each cavity of the plurality of cavities. The transducer array can have a pitch of less than fifty microns.

A transducer of the array of transducers can be a piezo-electric micro-machined ultrasonic transducer. A transducer of the array of transducers can be a capacitive micro-machined ultrasonic transducer, a bolometer, or any other technology to enable sufficient resolution and frequency to produce ultrasonic waves (or infrared light) capable of imaging a biometric object. Transducers, transducer arrays, bolometer, or other imaging devices disclosed herein can be implemented as a top or other layer of an application specific integrated circuit (ASIC), complementary metal-oxide-semiconductor (CMOS), or other such device (e.g., other layers of the device can include additional circuitry). The device can further comprise a controller coupled to the array. The controller can be configured to induce the array of transducers to transmit ultrasonic pressure waves. The controller can be configured to induce the array of transducers to receive reflections of the transmitted ultrasonic pressure waves from a physical object. The controller can be configured to induce the array of transducers to generate an image of the object. Vias of the plurality of electrically conductive vias can each define a substantially linear electrically conductive path through one or more layers of the device. The electrically conductive paths can each traverse a cavity of the plurality of cavities The device can further include a controller configured to induce the array of transducers to transmit ultrasonic pressure waves and receive reflections of the transmitted ultrasonic pressure waves from a physical object to image the object. The electrically conductive paths can electrically couple the controller to the array of transducers.

In accordance with an example implementation, a device may be provided which can include a means for generating ultrasonic pressure waves, the means for generating the ultrasonic pressure waves including an array of transducers; and a means for receiving the ultrasonic pressure waves, the means for receiving the ultrasonic pressure waves including the array of transducers, wherein transducers of the array of transducers have a pitch of less than fifty microns.

The array of transducers can be disposed on a substrate. The transducer array can be manufactured through the use of film deposition techniques. The device can be manufactured on a single substrate. The device can include a plurality of cavities defined by the device and the cavities enable movement of transducers of the array of transducers. The device can include dual-purpose vias, a first purpose of the dual-purpose vias to enable etching of the cavities and a second purpose of the dual-purpose vias to provide an electrically conductive path through a layer of the device. Each of the dual-purpose vias can form a substantially linear electrically conductive path through the layer of the device.

BRIEF DESCRIPTION OF THE DRAWINGS

Aspects of the disclosure are illustrated by way of example. In the accompanying figures, like reference numbers indicate similar elements.

DETAILED DESCRIPTION

Figure 1:
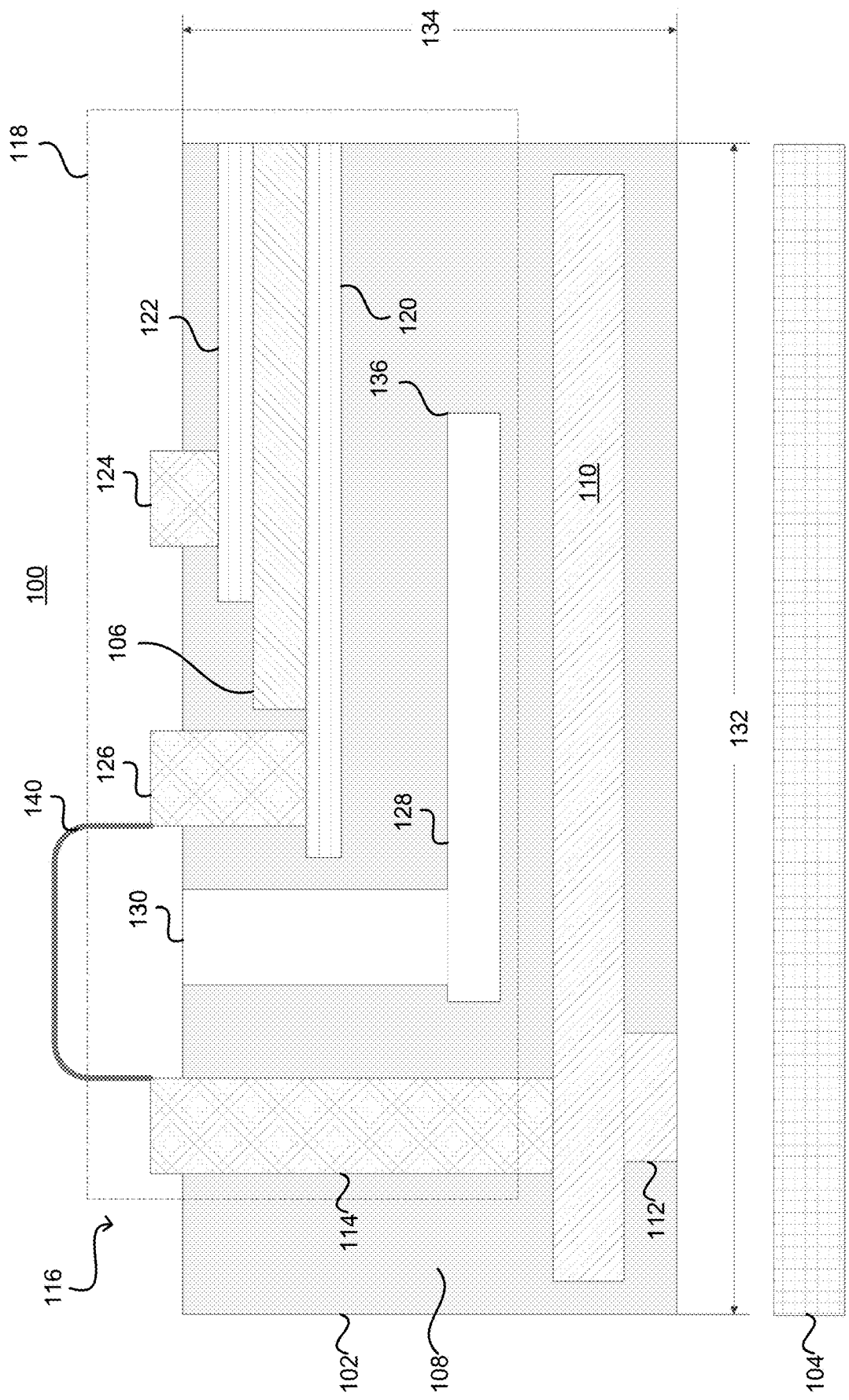
FIG. 1 illustrates a simplified diagram of a first MEMS ultrasound transducer array system that embodies one or more features of the disclosure.

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure or the spirit of the appended claims.

An ultrasonic (US) transducer array can be used as a biometric sensor that can be used for imaging biometric signatures (such as fingerprints) and can be a component of a mobile electronic device. In mobile electronic devices, space may be limited for integration of a biometric sensor due to the desire to minimize physical device sizes and maximize space for other components. For example, an exterior of a mobile device can be optimized for a display screen, leaving less room for biometric or other sensors. Additionally, integration of functionality of an US sensor with other components (such as a button, LCD screen, or other) can further limit available size for implementation of a biometric sensor.

Furthermore, a certain resolution of ultrasonic imaging may be desired for capturing acceptable resolutions of biometric images that can be used in the determination of biometric features of a user (e.g., ridges or valleys of a fingerprint). In certain embodiments, each transducer of an array can be used to sense a pixel of an ultrasonic image. Thus, increasing a number of transducers of an array can increase the resolution of images that the array is capable of capturing (while also increasing the physical size of the transducer array, all other variables being equal).

Physical sizes of transducer arrays can be limited or dictated by many factors. For example, each transducer can be limited by physical properties of the transducer, such as an amount of material or a size needed to generate specific frequencies of ultrasonic waves. Furthermore, electrically conductive paths (e.g., interconnects) to electrodes or other electrically conductive features of a transducer can require a certain amount of physical space depending on, for example, a specific manufacturing technique. Electrically conductive paths may enable individual addressing of transducers of an array of transducers. Individual addressing can enable ultrasonic imaging by enabling generation and/or detection of ultrasonic waves incident at each transducer.

Furthermore, each transducer of an array of transducers can be enabled to move (and thus generate or react to ultrasonic waves) by use of a void or cavity between a layer of an array of transducers and each transducer element. One method of creating a high density, small scale transducer array is through the use of film deposition techniques. In film deposition techniques, layers can sequentially be deposited on a substrate. For example, a transducer layer can be deposited on top of another layer previously deposited on the substrate. Etching, masking, and other techniques can be used to shape each layer. The cavities that enable movement of each transducer can be etched or evacuated from a device after deposition of the transducer layer (as will be further disclosed herein). Thus, a via may be required to enable access to the cavity, which may require additional physical space on the device and can further limit the size of the device for a given imaging resolution.

One method of minimizing an array of transducers is to minimize a pitch (i.e., the distance center-to-center between each transducer of an array, providing a denser array of ultrasonic transducers for a given desired imaging resolution. However, as disclosed, the pitch can be limited by certain features, including: the size of each transducer, electrically conducive vias for electrically addressing each transducer, via(s) to create cavities to enable movement of transducers, and other factors. Disclosed herein are techniques for enabling creation of high density arrays of transducers to minimize the physical size of the array for a given desired imaging resolution.

MEMS is a technology of very small devices that can be referred to as micromachines or micro systems technology. MEMS techniques generally use semiconductor device fabrication techniques (such as film deposition techniques) and can be used to make transducer arrays discussed herein. Piezoelectric Micro-machined Ultrasonic Transducers (PMUT) and Capacitive Micro-machined Ultrasonic Transducers (CMUT) are example types of ultrasonic transducers that can be fabricated using MEMS techniques. It should be understood that the physical scale of these devices can present unique challenges in fabrication, especially as they concern electromechanical devices such as ultrasonic transducer arrays.

The cost to produce a device (such as an ultrasonic transducer array) on a substrate using film deposition techniques can be influenced by several factors including the number of steps needed to manufacture the device and the density of the device. A wafer can be used as a substrate to manufacture one or more such devices. The smaller the device, the more devices can be manufactured on a singular wafer. Therefore, there can be a direct correlation between the size of an US transducer array and the cost to manufacture the US transducer array. For a given target imaging resolution of an US transducer array, the density of the US transducer array can dictate a physical size of the array. Additionally, the number of substrates/wafers needed to manufacture a device can also impact the cost of the device. A device manufactured using film deposition techniques on multiple wafers and then later joining the wafers can be relatively expensive to manufacture as compared to a device using a singular wafer. It is therefore advantageous to develop processes and structure that enable the manufacture of relatively dense US arrays using a singular substrate, as disclosed herein, to reduce the cost to manufacture such devices while maintain viable US imaging capabilities (e.g., meeting a target imaging resolution requirement) for a given size of US transducer array.

An US transducer array can comprise a plurality of transducers. As used herein, a transducer is a device that converts variations in a physical quantity (such as pressure) into an electrical signal, and/or vice versa. A transducer can convert an electrical signal into a physical quantity and/or a physical quantity into an electrical signal. An example transducer can enable a speaker receiving an electrical signal to produce audio. A transducer for speakers can contain a permanent magnet attached to a membrane. A magnetic field produced by an electromagnet activated by the electrical signal can induce the permanent magnet to be repelled or attracted to the electromagnet. The membrane can correspondingly create pressure waves as air is displaced. A microphone uses a similar mechanism except that pressure waves can cause an electromagnet to vibrate/move and a corresponding electrical signal generated by the electromagnet. An US transducer array can therefore be visualized as a giant array of transducers, each operable to generate audio pressure waves in response to applied electrical signals and/or generate electrical signals in response to applied audio pressure waves. However, it should be understood that the scale of US transducer arrays for use in mobile devices to image biometric features can be minute. For example, each transducer can be built on a miniscule scale and each transducer can be individually addressable.

FIG. 1 illustrates a simplified diagram of the cross section of a system 100 that may incorporate one or more features of certain embodiments. The system 100 can include an US transducer array 102. Illustrated is a cross-sectional view of a singular transducer of the US transducer array 102. The US transducer array 102 can be manufactured on a substrate (not shown). The substrate can include a redistribution layer 110 that can be manufactured onto the substrate using through-hole vias, for example. As used herein, a via is a pathway through one or more layers of a device. The pathway can be used to form a cavity or conduit through a device to access feature(s) of the device. A via can also be filled in (partially or fully) with a material that may be different from a layer that the via traverses. Film deposition or other techniques can be used to manufacture a device on a substrate, as further described herein. A layer of a device that is traversed by a via can be formed, either directly or indirectly (e.g., on top of intermediate layers), on a substrate. Redistribution layer 110 can comprise a plurality of contacts/pads to enable the US transducer array 102 to be joined with a separate substrate comprising control circuitry 104 for the US transducer array 102. Alternatively, the control circuitry 104 (or portions of control circuitry 104) can be deposited on a substrate and the US transducer array 102 which can, in turn, be deposited directly on top of the control circuitry. Portion 118 of US transducer array 102 can be considered a transducer cell (e.g., each cell can correspond to a single pixel that can be imaged by US transducer array 102).

The control circuitry 104 can be used to enable individual addressing of each transducer cell (such as portion 118) of US transducer array 102. Control circuitry 104 can include multiplexing functionality to enable individual addressing using minimal channels to a logic device. Control circuitry 104 can include one or more logic devices to enable functionality pertaining to generating, receiving, or processing US pressure waves to form US images. By depositing the US transducer array 102 onto a singular substrate (not shown), the entire array can be manufactured for relatively low cost using film deposition or other techniques, as will be described herein.

Piezoelectric material 106 can be used to form a PMUT transducer. When electrical power is applied to a piezoelectric material, the material can deform or vibrate depending on the amplitude, periodicity, and/or waveform of applied electrical power. Electrodes 120 and 122 can be electrically coupled to the piezoelectric material 106 to provide an electrically conductive path to the piezoelectric material 106 for application of a voltage potential. Portion 118 can include piezoelectric material 106 to form a transducer. Portion 118 can be one of many cells forming an array of transducers. As an array, each transducer can individually be stimulated using an electric signal to form an ultrasonic pressure wave from each transducer. Additionally, received ultrasonic pressure waves incident upon piezoelectric material 106 can cause the material to generate electrical potential difference(s).

An US image can be formed by an array of piezoelectric cells by individually controlling the generation of US energy from each cell of an array and detecting reflected US energy incident upon each individual cell. For example, a time delay between transmitted and received ultrasound pressure waves can be used to determine a distance to an object. The geometry of the array and time differences between outgoing and incident US waves can be used to form an US image of an object which the US waves are incident upon by comparing electrical signals generated by each transducer cell. Each transducer cell can therefore form a pixel of an ultrasonic image. The resolution of the US image can be dictated by the resolution of the US transducers.

Alternatively, the transducer can be a CMUT. CMUT transducers differ from PMUT transducers in that, instead of taking advantage of piezoelectric effects, capacitive effects are used. Therefore, CMUT transducers need not use piezoelectric material and instead can produce and react to US pressure waves due to changes in capacitance. For purposes of this disclosure, a transducer is non-limiting and can be PMUT, CMUT, or use other methods to convert electrical signals to physical properties and/or vice/versa. As will be described herein, both PMUT and CMUT transducers can utilize a cavity in order enable the transducers to move and/or vibrate (to produce and in response to US pressure waves). As will be further disclosed, the cavity can partially separate a transducer from surrounding material Given space constraints for implementing an US array of transducers, such as US transducer array 102, in a mobile device such as a smartphone, US transducer array 102 can be fabricated using MEMS techniques to enable US transducer array 102 to be manufactured on a relatively miniscule scale. One such MEMS technique can use film deposition fabrication techniques in constructing the US transducer array 102. Film deposition fabrication techniques can generally include depositions of successive and alternating layers of semiconductor, dielectric, and/or metallic materials and are commonly used to fabricate electronic devices such as processors, LCDs, etc. The film deposition techniques can take the form of additive and/or subtractive processes wherein subsequent patterns of materials are deposited and/or etched or evacuated from a device stack. A stack can be a stack of layers that are deposited onto a substrate. These techniques will be described in greater detail herein, but should aid in understanding the structure depicted in FIG. 1 and, more specifically, the layered structure of the components illustrated. Additionally, it should be understood that the techniques and structures described herein can be implemented on a relatively miniscule scale. For example, the thickness 134 of the US transducer array 102 can be less than twenty, ten, or five microns, for example.

FIG. 1 includes a dielectric layer 108 that can provide structural support to the US transducer array 102 as well as electrically insulating components of the US transducer array 102. The dielectric layer 108 can be formed from an oxide, such as $SiO_2$, or other suitable materials. The optional redistribution layer 110 is also depicted as part of the US transducer array 102. The redistribution layer 110 can include pads 112 or other like features that can correspond to features of the conductive layer of control circuitry 104. These features can aid in alignment between the US transducer array 102 and the control circuitry 104, such as when the US transducer array 102 is separately fabricated and then applied to control circuitry 104. Although control circuitry 104 and redistribution layer 110 are illustrated as being physically separated, they can be joined and/or manufactured on the same substrate. Each pad 112 can be electrically coupled to a corresponding electrode of a conductive element of control circuitry 104 to provide isolated electrical connections between the US transducer array 102 and a separate device. The separate device can include control electronics for the US transducer array 102 including the electronics required to drive the transducers to create US pressure waves as well as circuitry to detect changes in electrical signals produced by the transducers in response to applied US pressure waves.

A contact via 114 can provide an electrically conductive path from the top of the US transducer array 102 to the optional redistribution layer 110 and ultimately to control circuitry 104. When referencing the top of the US transducer array 102, in the embodiment shown in FIG. 1, the term "top" is used for ease of understanding and is the side indicated by arrow 116. The top of the US transducer array 102 can be the side from which ultrasonic pressure waves are emitted and/or received for US imaging. The top of the US transducer array 102 can indicate the direction from which layers are deposited, removed, or etched during manufacture using film deposition techniques. A via, as used herein, is a path that can extend between layers of a fabricated device, such as one using film deposition techniques. A via can be conductive, can define a void, can be non-conductive, or can include a combination of these features. A via can also be used temporarily and/or intermediately during a fabrication process (e.g., between deposition or etching of layers as the device stack is manufactured). For example, a certain via can be etched through layer(s) of a device. The same via can later be filled or coated. Contact via 126 can be used to provide an electrical path through the dielectric layer 108. As an example, contact via 126 can be electrically coupled using an electrical path 140 to the conductive via 114 and to the electrode 120. In this manner, the control circuitry 104 can be electrically coupled to the electrode 120 via the use of the redistribution layer 110.

The portion 118 of the US transducer array 102 can generally be considered as an ultrasonic transducer cell (and can correspond to a pixel of an US image captured using the US transducer array 102). The piezoelectric material 106 can be used to produce and receive US pressure waves for the US transducer array 102. Electrodes 120 and 122 can comprise molybdenum, for example, and can be used to provide electrical coupling to piezoelectric material 106 for application or detection of a voltage potential difference. Transducer vias 124 and 126 can provide an electrical pathway through the dielectric layer 108 to electrodes 120 and 122 respectively from the top of the US transducer array 102. A voltage applied across transducer vias 124 and 126 can induce the piezoelectric material 106 to mechanically actuate (e.g., move or vibrate). Likewise, a mechanical force acting upon the piezoelectric material 106 can generate a voltage potential difference between transducer vias 124 and 126.

Given the nature of the electromechanical features of the portion 118 (e.g., the movement of piezoelectric material 106 upon application of an electrical potential difference), a cavity 128 can be provided to enable movement of piezoelectric material 106. A cavity, such as cavity 128, can be a void in the dielectric layer 108 and can allow the piezoelectric material 106 to move to generate pressure waves and in response to pressure waves incident upon the piezoelectric material 106. Without the cavity 128, the piezoelectric material 106 may be anchored in position by being mechanically coupled to dielectric layer 108, thus preventing the US transducer array 102 from functioning for its intended purpose (e.g., preventing each transducer to generate or detect US pressure wave(s) suitable for US imaging). The movement of piezoelectric material 106 can induce a levered motion around pivot point 136, for example. Alternatively, portion 118 can includes structures (including piezoelectric material 106) suspended on an optional membrane. The term "cavity," as used herein, broadly refers to a space or relatively less dense material allowing movement of a structure, such as the piezoelectric material 106 which is mechanically coupled to dielectric layer 108. A cavity may take on various physical shapes and dimensions. As such, the cavity 128 need not be a complete void. The cavity 128 can include porous or other materials that may not be rigid and therefore not hinder the movement of the transducer. For example, material can be added to absorb moisture, to dissipate heat, to dissipate standing pressure or other waves inside of the cavity, or for other purposes. Such material can be porous to allow air movement, and/or compression/expansion of air. The cavity 128 can be pressurized for certain applications to provide a positive or negative pressure bias.

The release via 130 can be used as a pathway for the formation of the cavity 128. As stated previously, the US transducer array 102 can be formed using film deposition techniques and, more specifically, substantially using sequentially additive layering wherein each new layer is deposited on top of a previously deposited layer. As an intermediate step in a film deposition manufacturing process, a sacrificial material can be used in the location of the cavity 128 during one layer deposition step in order to provide structural support for successive layers. During subsequent steps of the process, the release via 130 can be etched (through photolithography, chemical means, or other) through US transducer array 102 to gain access to the sacrificial material from the top of the US transducer array 102, for example. An additional etching step can then be used to dissolve and/or remove the sacrificial material to from the cavity 128. The release via 130 can then optionally be sealed if it is desired to protect the cavity 128 from moisture from the surrounding environment, for example, or the release via 130 can remain unsealed to provide a ported cavity.

One result of the fabrication process described for the formation of the structure described in FIG. 1 is to use four separate vias for the formation of each US transducer cell (such as indicated by portion 118), namely two transducer vias 124 and 126, one release via 130, and one contact via 114. Given that a certain amount of separation may be needed between the vias to prevent electrical shorting between them, due to limits in manufacturing techniques, and/or to avoid compromising the physical structure of the US transducer array 102, the use of four vias can be a factor dictating a minimal US transducer cell separation distance 132. This distance can therefore prevent the US transducer array 102 from surpassing a certain density by requiring a minimum distance between US transducer cells to provide enough distance for use of the four vias. Although this distance 132 is visually represented in only one dimension, it should be understood that the US transducer array 102 can form an array of various configurations and that the use of four vias for each cell can limit the pixel pitch of the array (i.e., how densely packed the US transducer cells can be arranged) regardless of the configuration. US arrays with pixel pitch density of less than fifty microns may not be possible using the structure of FIG. 1 due to limitations imposed through the use of the four vias for the formation of each transducer cell (and the spacing requirements needed for etching the four vias). Note that for FIGS. 2-12, certain reference numerals can be shown in the figure but not explicitly mentioned in the text, because they may be mentioned in prior figures.

Figure 2:
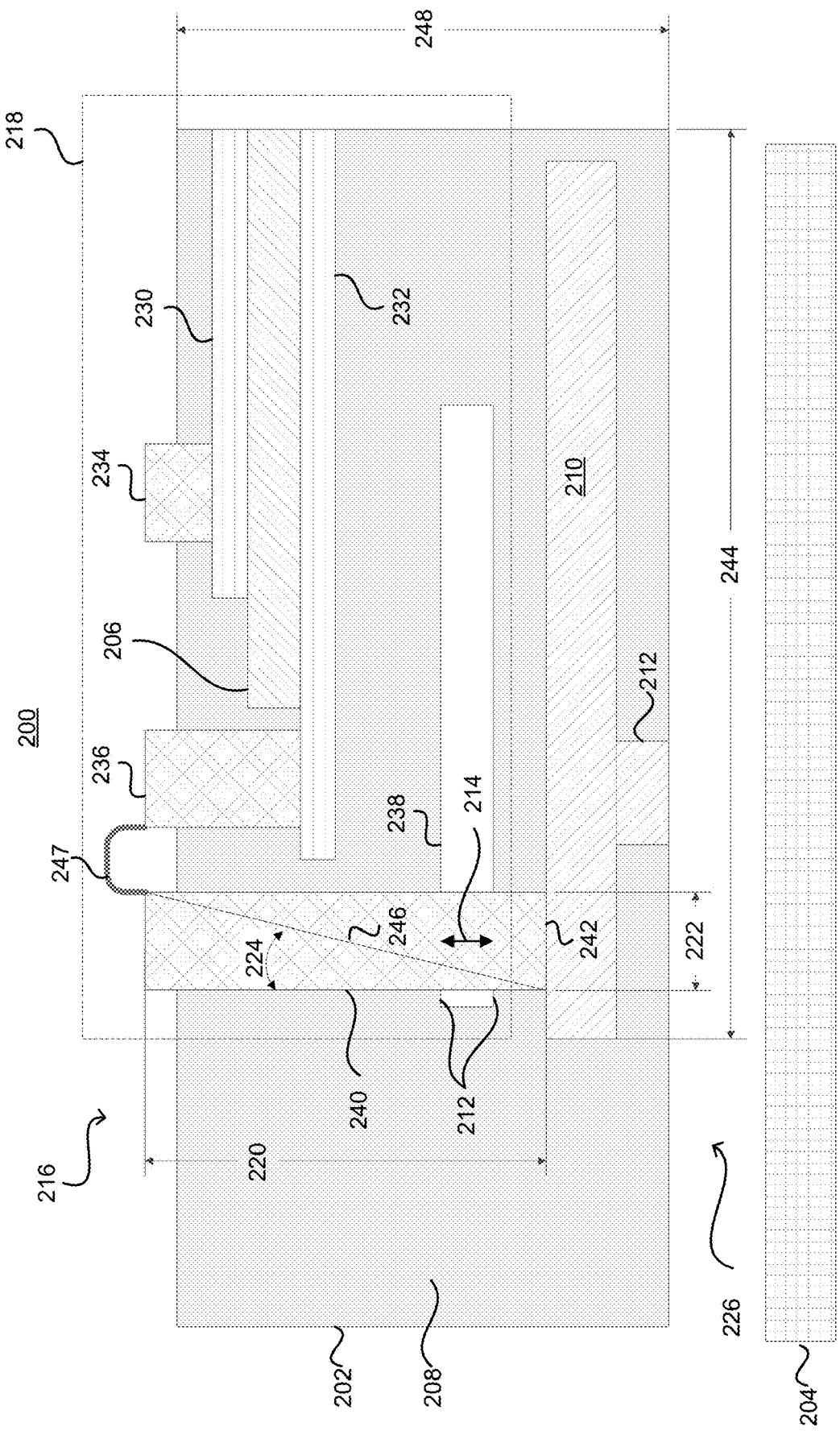
FIG. 2 illustrates a simplified diagram of a second MEMS ultrasound transducer array system that embodies one or more features of the disclosure.

FIG. 2 illustrates a simplified diagram of the cross section of a system 200 that may incorporate one or more embodiments of the disclosure. Here, a release via, such as release via 130 of FIG. 1, is not present in the illustrated system 200. Instead, a dual-purpose via 240 is illustrated. The dual-purpose via 240 can provide the functionality of release via 130 and contact via 114 of FIG. 1. The system 200 of FIG. 2 can allow the US transducer array 202 to function through the use of only three vias extending from the top (indicated by arrow 216) of the US transducer array 202. These three vias are the contact vias 234 and 236 and the dual-purpose via 240. By reducing the number of vias needed to manufacture each US cell 218, the US transducer array 202 can be fabricated with a higher pixel pitch as compared to the US transducer array 102 of FIG. 1 (assuming other variables pertaining to features sizes, physical constraints, etc. are constant). As illustrated, the distance 244 between cells depicted in FIG. 2 can be less than the distance 132 depicted in FIG. 1. The structure of system 200 of FIG. 2 can allow the fabrication of US transducer arrays 202 with pixel pitches of less than fifty microns and therefore can be more suitable for use with mobile electronic devices. US transducer array 202 can provide a relatively higher density US imaging array than the US transducer array 102. The thickness 248 of the US transducer array 202 can be similar to thickness 134 of US transducer array 102 shown in FIG. 1.

Furthermore, the proximity of the dual-purpose via 240 to the contact via 236 can simplify manufacturing steps related to coupling the two vias together using an electrical path 247, because release via 130 is no longer needed to evacuate cavity 238, as will be further disclosed. Also, as will be disclosed herein, dual-purpose via 240 can also enable an electrical path to be formed through a layer of US transducer array 202. FIG. 2 also illustrates that the dual-purpose via 240 can extend through the dielectric layer 208 to contact the optional redistribution layer 210 at location 242 (or another feature of system 200). The dual-purpose via 240 can alternatively extend linearly through the US transducer array 202 to contact control electronics 204 without the use of the redistribution layer 210. Dual-It should be noted that the release via 130 of FIG. 1 does not extend through the dielectric layer 108 to make contact with redistribution later 110, as this is unnecessary for purposes of etching the cavity 128. The system 200 can be manufactured using a singular substrate/wafer, minimizing material costs for production of the US transducer array 202, as will be described herein.

The US transducer array 202 can be referenced as having two generally planar sides that can be referred to as the top (indicated by arrow 216) and the bottom (indicated by arrow 226). However, it should be understood that the bottom side illustrated can be mechanically coupled to another layer of the device or a separate device. These planar sides can form substantially planar surfaces on opposing sides of the ultrasonic array due to the nature of the manufacturing process of such a device, such as through the use of film deposition techniques. Because the dual-purpose via 240 can be etched through the dielectric layer 208 of the device, the resulting via can be relatively tall and thin. For example, the longest dimension 246 of the via 240 can be offset less than twenty degrees 224 as compared to a reference normal to a planar top or bottom side. Alternatively or additionally, the length 220 of a dimension of the dual-purpose via 240 orthogonal to the planar top or bottom sides can be greater than the length 222 of a dimension of the dual-purpose via 240 parallel to the planar top or bottom sides. The length 220 can, for example, be greater than twenty, ten, or five times the length 222. Also, as a result of an etching process that can be used to create the dual-purpose via 240, the electrically conductive path formed by the via dual-purpose 240 can be substantially linear (i.e., straight) as it traverses the cavity 238. The substantially linear traversal of cavity 238 can include gaps or non-contiguous sections of electrically conductive path. The gaps or non-contiguous sections can be patches resulting from, for example, sputtering of conductive material through dual-purpose via 240. However, electricity may still flow around these "patches." The electrically conductive path can include electrically conductive material defining a portion of cavity 238. For example, the material can be sputtered or otherwise deposited onto the interior surface of a via to form dual-purpose via 240. The deposition process can induce gaps and/or other inconsistencies in the physical distribution of electrically conductive material. The electrically conductive path can traverse the cavity 238 by in a direction illustrated by arrow 214 as the electrically conductive via traverses two opposing sides 212 of the cavity 238.

System 200 can include piezoelectric material 206 that can act as an element of a transducer. Piezoelectric material 206 can be electrically coupled to electrodes 230 and 232 which can, in turn, be electrically coupled to contact vias 234 and 236 respectively. If a voltage potential difference is applied across contact vias 234 and 236, piezoelectric material 206 can vibrate or otherwise react to create an US pressure wave. If an US pressure wave is incident upon piezoelectric material 206, then a voltage potential difference can be induced across contact vias 234 and 236.

Figure 3:
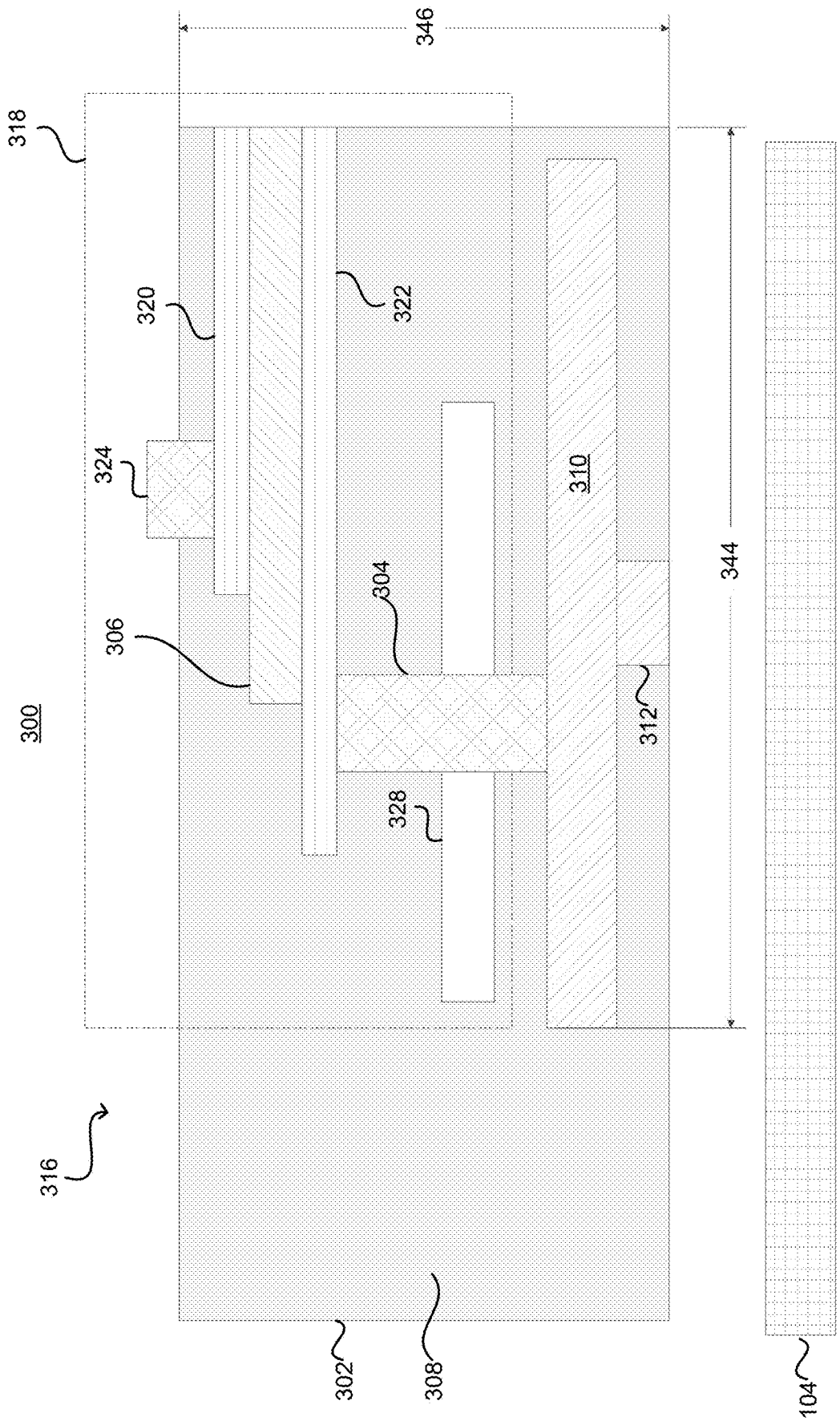
FIG. 3 illustrates a simplified diagram of a third MEMS ultrasound transducer array system that embodies one or more features of the disclosure.

FIG. 3 illustrates yet another embodiment of an US array system 300. The illustrated system 300 includes piezoelectric material 306 and corresponding structures to form an US cell similar in function to those of FIG. 1 and FIG. 2. The US array 302 of FIG. 3 also includes a dual-purpose via 304, similar to dual-purpose via 240, that can be used to etch the cavity 328 and to provide an electrically conductive path between electrode 322 and the redistribution layer 310. However, the dual-purpose via 304 differs from the dual-purpose via 240 in that dual-purpose via 304 is a buried via and does not extend to an exterior surface of the US array 302. This difference between the US transducer arrays 202 and 302 can result from a different manufacturing technique. As an example, the formation of the dual-purpose via 304 can occur before depositing layers containing the electrode 322, piezoelectric material 306, electrode 320, and the contact via 324. In this manner, electrode 322 can be electrically coupled to dual-purpose via 304 without extending dual-purpose via 304 to an exterior surface of the US array 302. Dual-purpose via 304 can be made conductive via sputtering or other techniques to deposit electrically conductive material within dual-purpose via 304. Additionally, the transducer can be implemented using PMUT, CMUT, or other techniques. Distance 344 can be similar to distance 244. Thickness 346 can be similar to thickness 248.

Fabrication techniques for creating MEMS devices can be relatively complex and costly. When using film deposition techniques, it can be desirable to minimize a number of fabrication steps require to deposit layers, create masks, remove features, create vias, etc. in order to reduce the cost and time of the fabrication process and to increase yields (e.g., reduce imperfections). Given the relatively small scale of the operations performed, even small imperfections induced by the fabrication process can render MEMS devices inoperable or unsatisfactory. As one example, if the evacuation of the release used with an US transducer cell does not sufficiently remove the majority of the sacrificial material, the US transducer cell may fail to operate or may cause damage to an US array.

Given these constraints, at least two difficulties can exist when attempting to create an US array using film deposition techniques. Namely, (1) the process of evacuating a release can remove electrically conductive contact material unintentionally, and (2) residue can remain from the sacrificial material when evacuating the release. The sacrificial material used to create a cavity can be silicone based, metallic, or other materials. These materials can be susceptible to etching using traditional wet, dry, or plasma etching. As explained earlier, the dual-purpose via 240 of FIG. 2 is illustrated as extending to the optional redistribution layer 210. The redistribution layer can also be made of a metallic substance. Therefore, if a release via were created through use of the sacrificial material and extended to the redistribution layer 210, and then an etching technique used to evacuate the sacrificial material, the redistribution layer may be compromised by the etching agent. Additionally, the etching step may leave residuals (e.g., unremoved etching agent and/or sacrificial material) that may prevent use of the release via to form a conductive via through a later process step. Also, in the case that a conductive material has already been applied to the release via, the etching step may compromise the conductive material applied to the release via.

In particular, given the geometry and size of the release, the evacuation etching can be difficult to perform and may leave remnants of the sacrificial material, thereby compromising the structure of the MEMS device. For example, the release of sacrificial material can be difficult due to a stiction effect whereby surrounding material can be pulled down and stuck to an underlying layer due to capillary forces induced during evacuation of the release. The same capillary forces can make it difficult to remove the etching compound from the substrate. FIGS. 4-12 illustrate steps of a process that, despite these difficulties, can be used to create an US transducer array 202 of FIG. 2. Pad 312 can be similar to pad 112.

Figure 4:
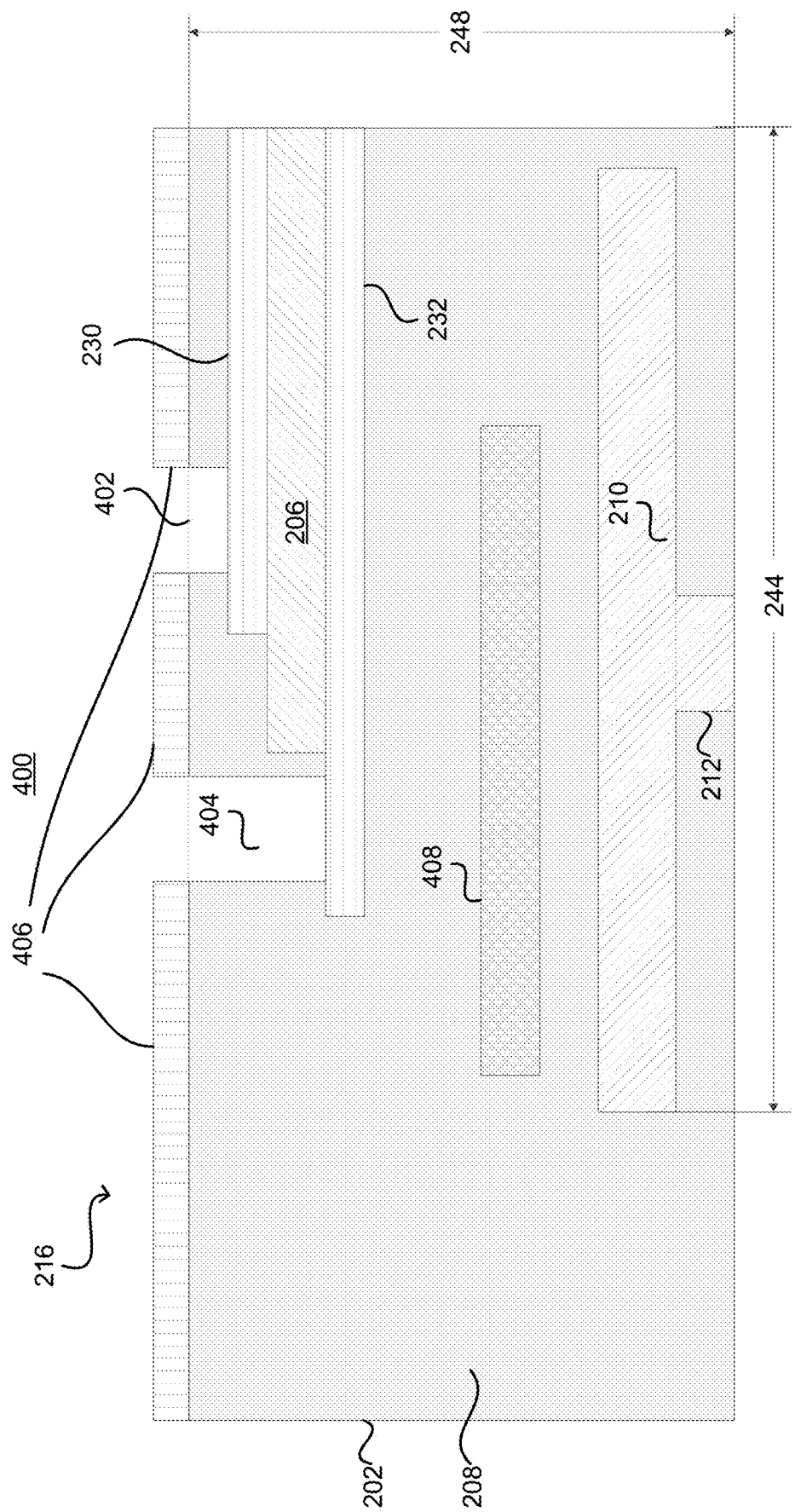
FIGS. 4-11 illustrate states of a MEMS ultrasonic array during a process for fabricating the system of FIG. 2 that embodies one or more features of the disclosure.

FIG. 4 illustrates a step in the fabrication process of the US transducer array 202 of FIG. 2. Illustrated in FIG. 4 is a device stack 400 that has been fabricated on top of a substrate (not enumerated). The top of the stack 400 is indicated by arrow 216. Redistribution layer 210 has already been formed onto a layer of the US transducer array 202. Additionally, sacrificial material 408 is embedded within a dielectric layer 208 of the US transducer array 202. Piezoelectric material 206 and corresponding electrodes 230 and 232 have also been formed. Illustrated are two vias 402 and 404 that have been etched in order to gain access to electrodes 230 and 232 from the top of the US transducer array 202 device stack. A photoresist film 406 has been deposited on top of the US transducer array 202 device stack as an example artifact from photolithographic etching of the vias 402 and 404.

Figure 5:
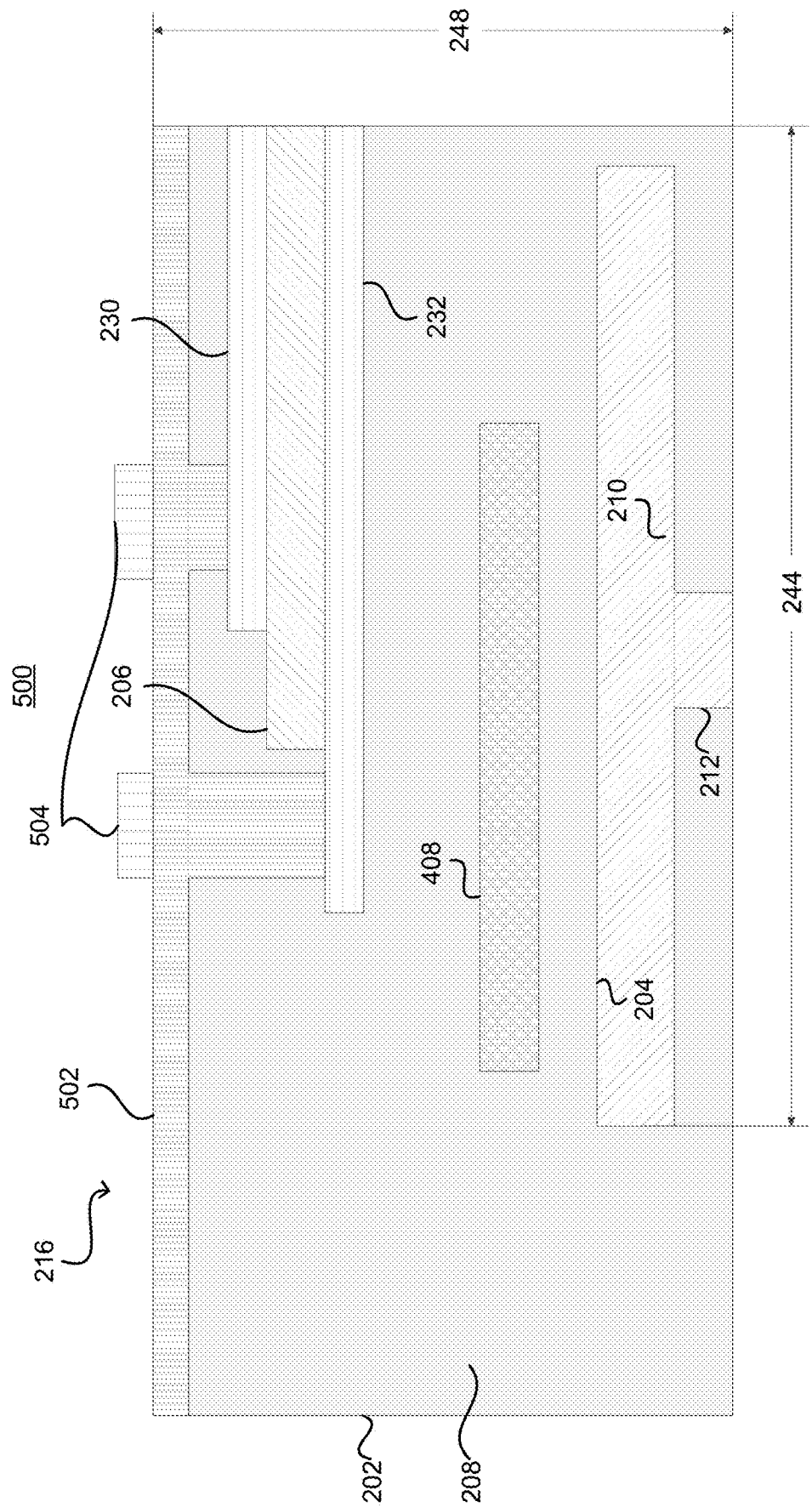

FIG. 5 illustrates a metalized layer 502 (such as an aluminum alloy, for example) being deposited on top of the US transducer array 202 device stack. The metalized layer 502 can be used to form the contact vias 234 and 236. Additionally, a photoresist mask 504 has been deposited on top of the metalized layer 502 for photolithographic etching that can be used as an example technique to pattern metalized layer 502 to define the contact vias 234 and 236. In the state of US transducer array 202 device stack illustrated in FIG. 5, the metallized layer 502 forms an electrical path between electrodes 230 and 232.

Figure 6:
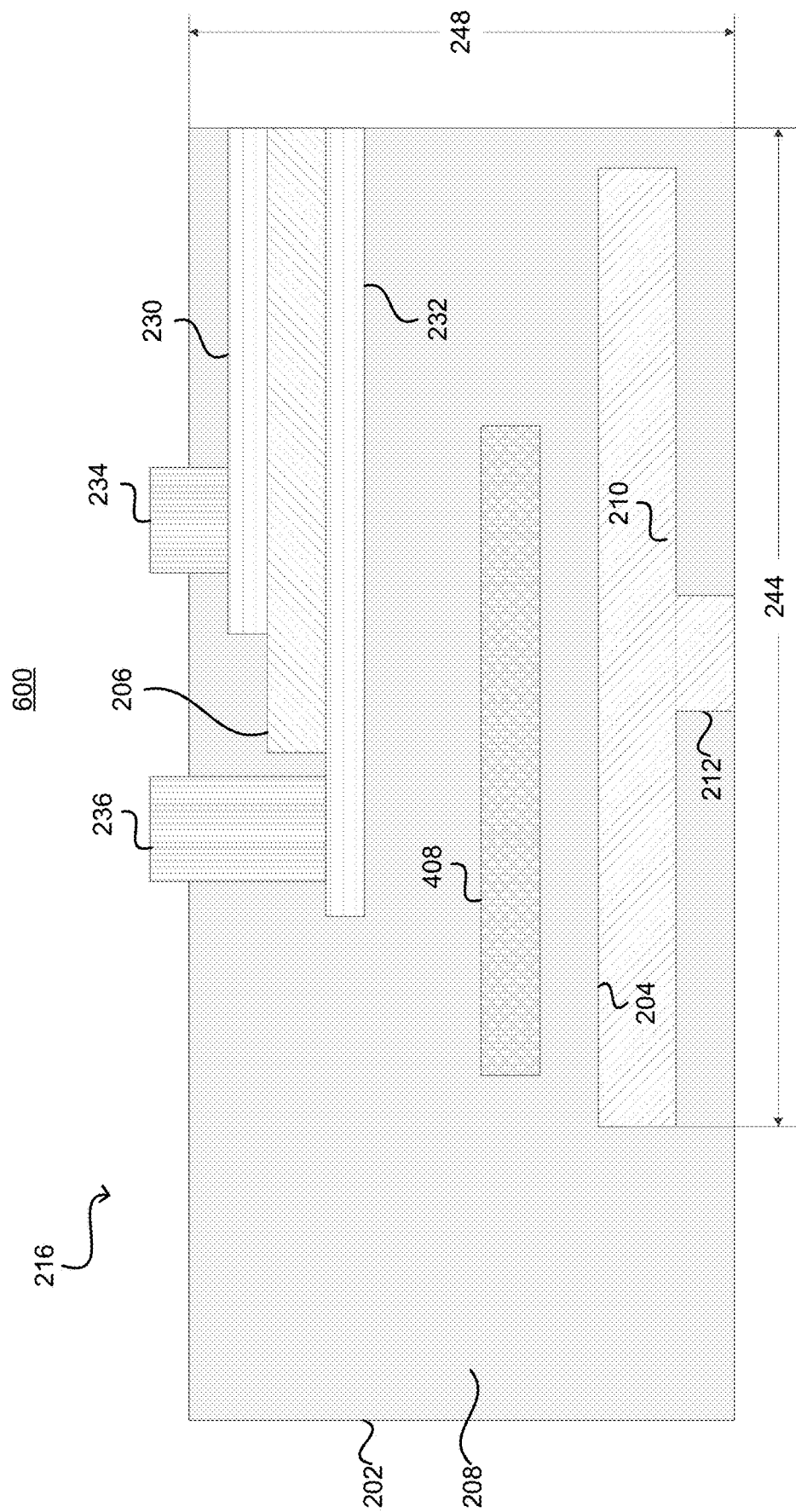
Figure 7:
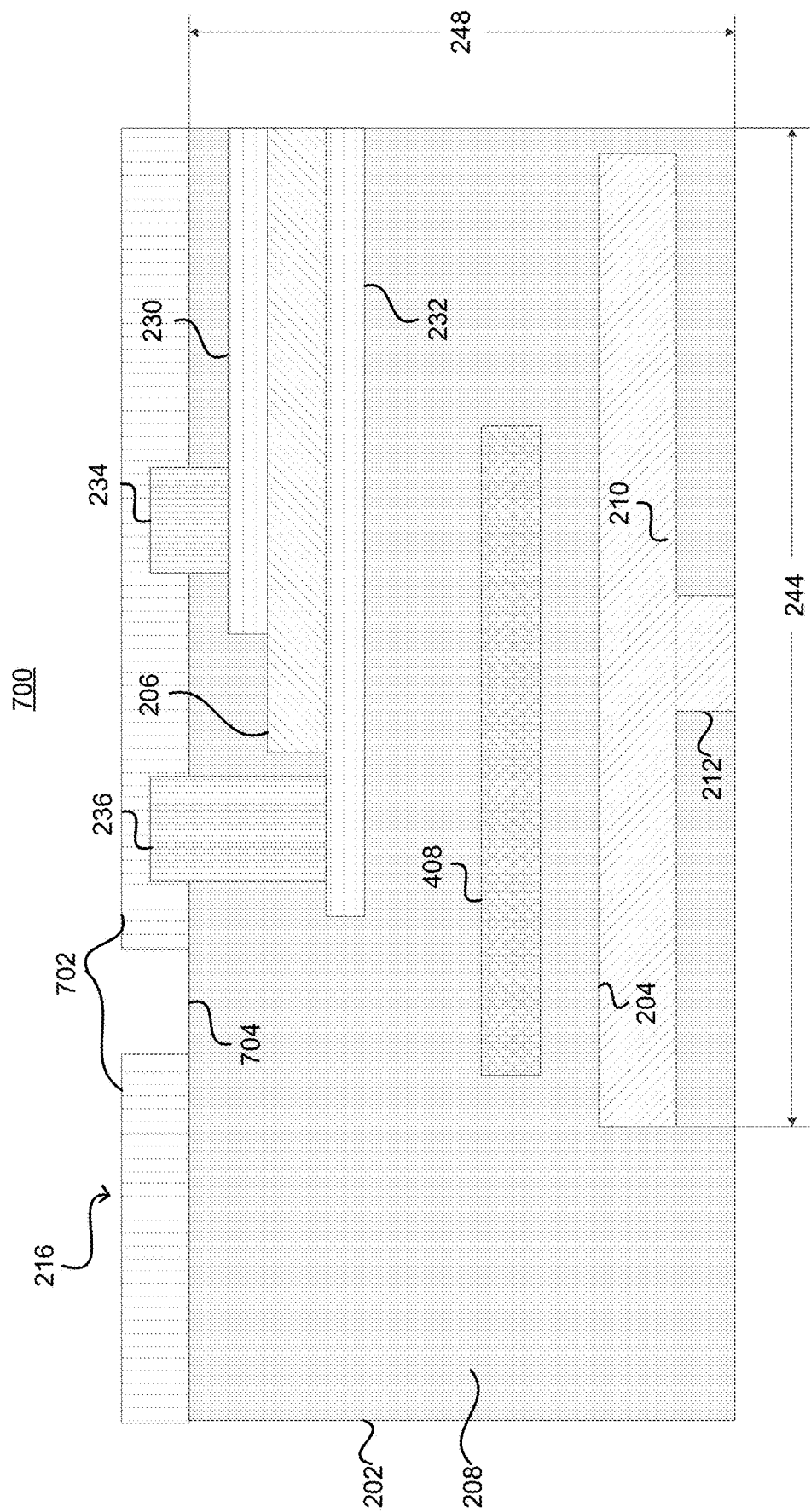

FIG. 6 illustrates the state of the US transducer array 202 after the metalized layer 502 has been etched and the photoresist mask 504 removed. The etching of the metalized layer 502 can form the contact vias 234 and 236 that are electrically coupled to electrodes 230 and 232 respectively. In FIG. 7, a photoresist mask 702 has been deposited. The photoresist mask 702 can cover the contact vias 234 and 236, but leave surface area 704 exposed. Surface area 704 can be used to form a new via through etching.

Figure 8:
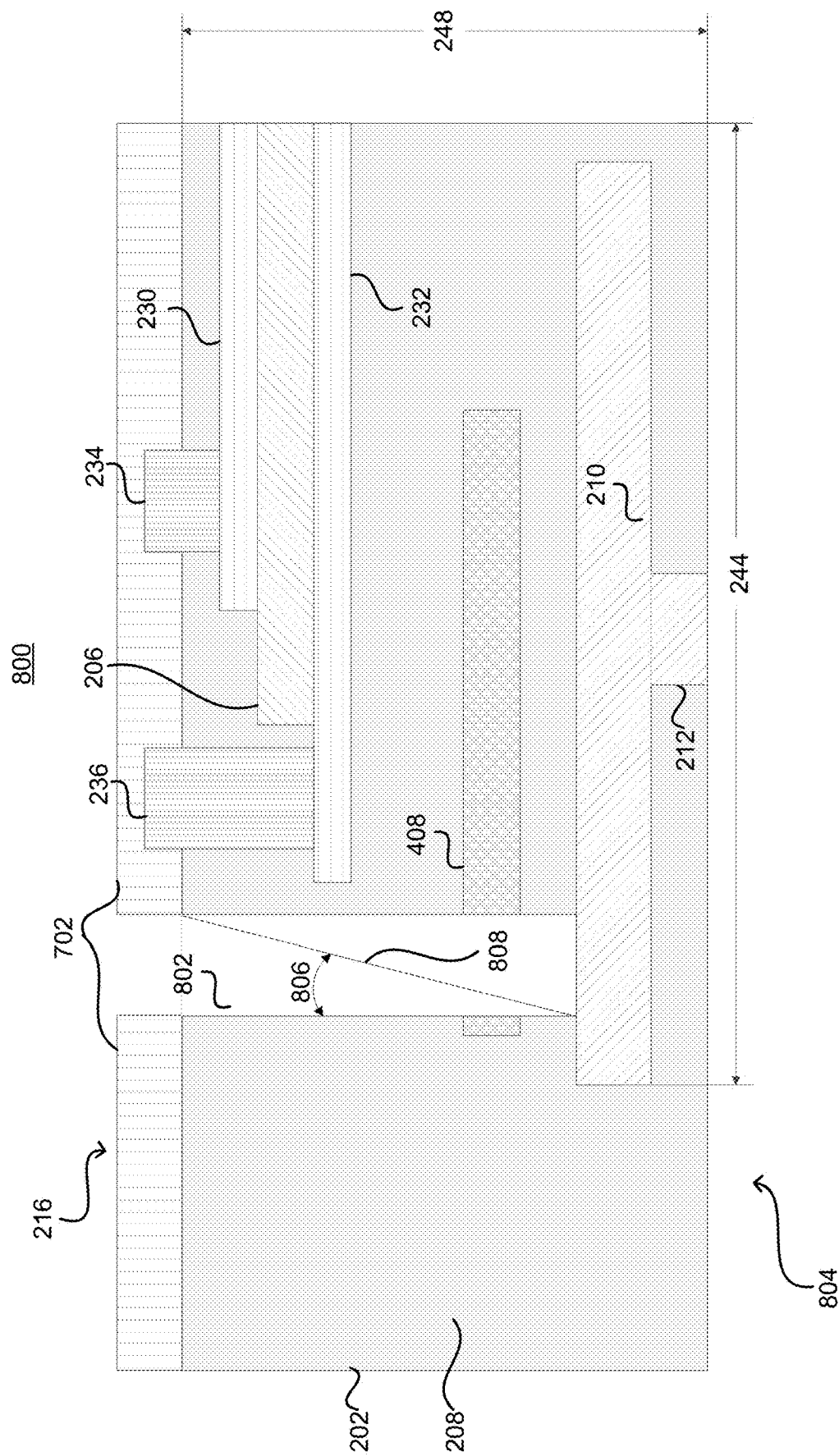

In FIG. 8, a via 802 has been formed from the top of the US transducer array 202 to the optional redistribution layer 210. This etching can be performed using photolithography, for example. It should be noted that the process of etching the via 802 can result in a via that is generally linear and can be substantially orthogonal to a side of the substrate, as illustrated. For example, the US transducer array 202 can be referenced as having two generally planar sides, one on top (indicated by arrow 216) and one on bottom (indicated by arrow 804). However, it should be understood that the bottom side illustrated can be mechanically coupled to another layer or component. These planar sides can form substantially planar surfaces on opposing sides of the ultrasonic transducer array 202 due to the nature of the manufacturing process of such a device. The longest dimension 808 of the via 802 can be offset less than twenty degrees 806 as compared to a reference normal to a planar side. Via 802 also extends through and exposes sacrificial material 408. In FIG. 8 (and other figures) certain reference numerals are showed in the figure but not explicitly mentioned in the text, because they are mentioned in prior figures.

Figure 9:
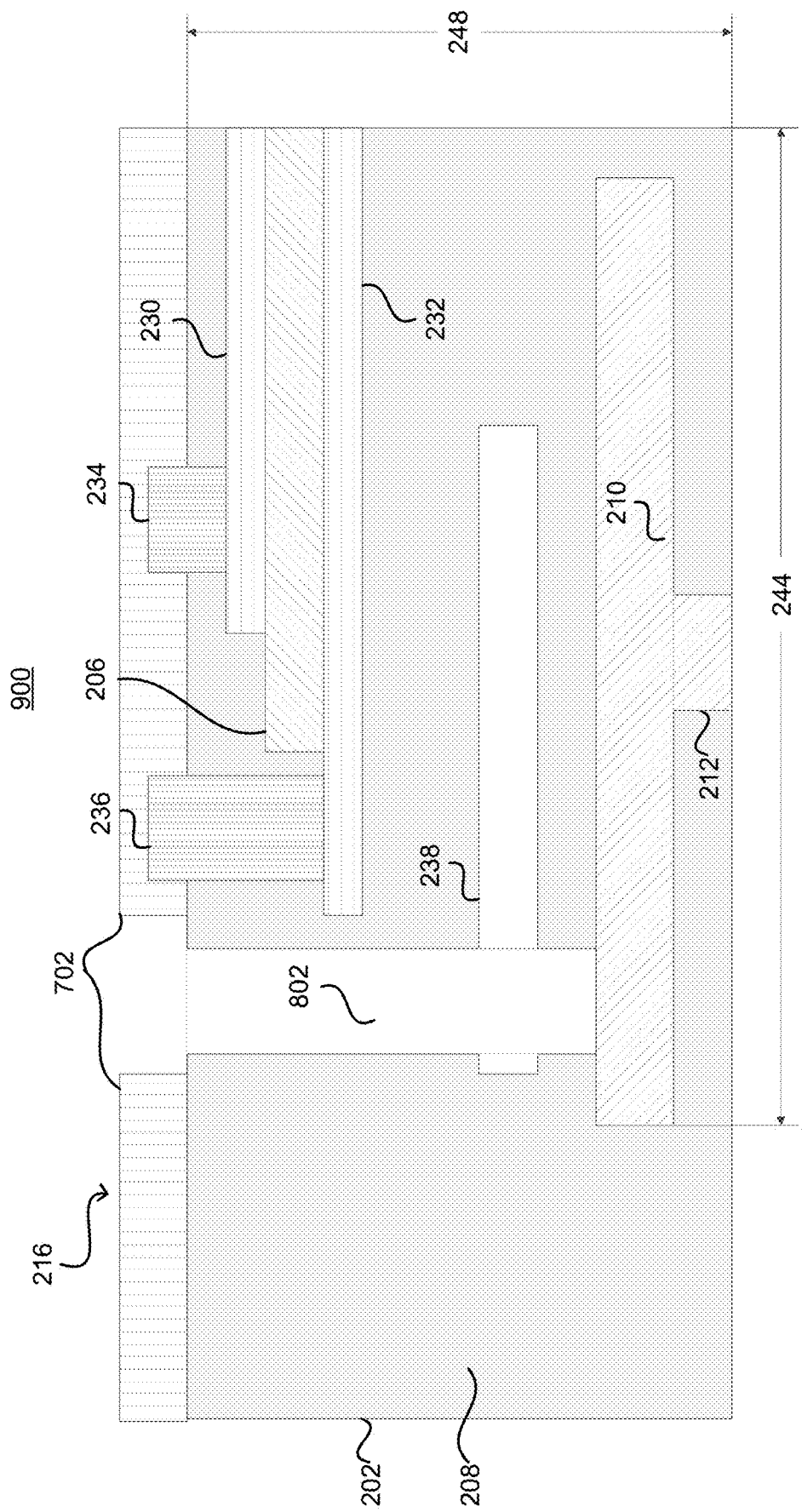
Figure 10:
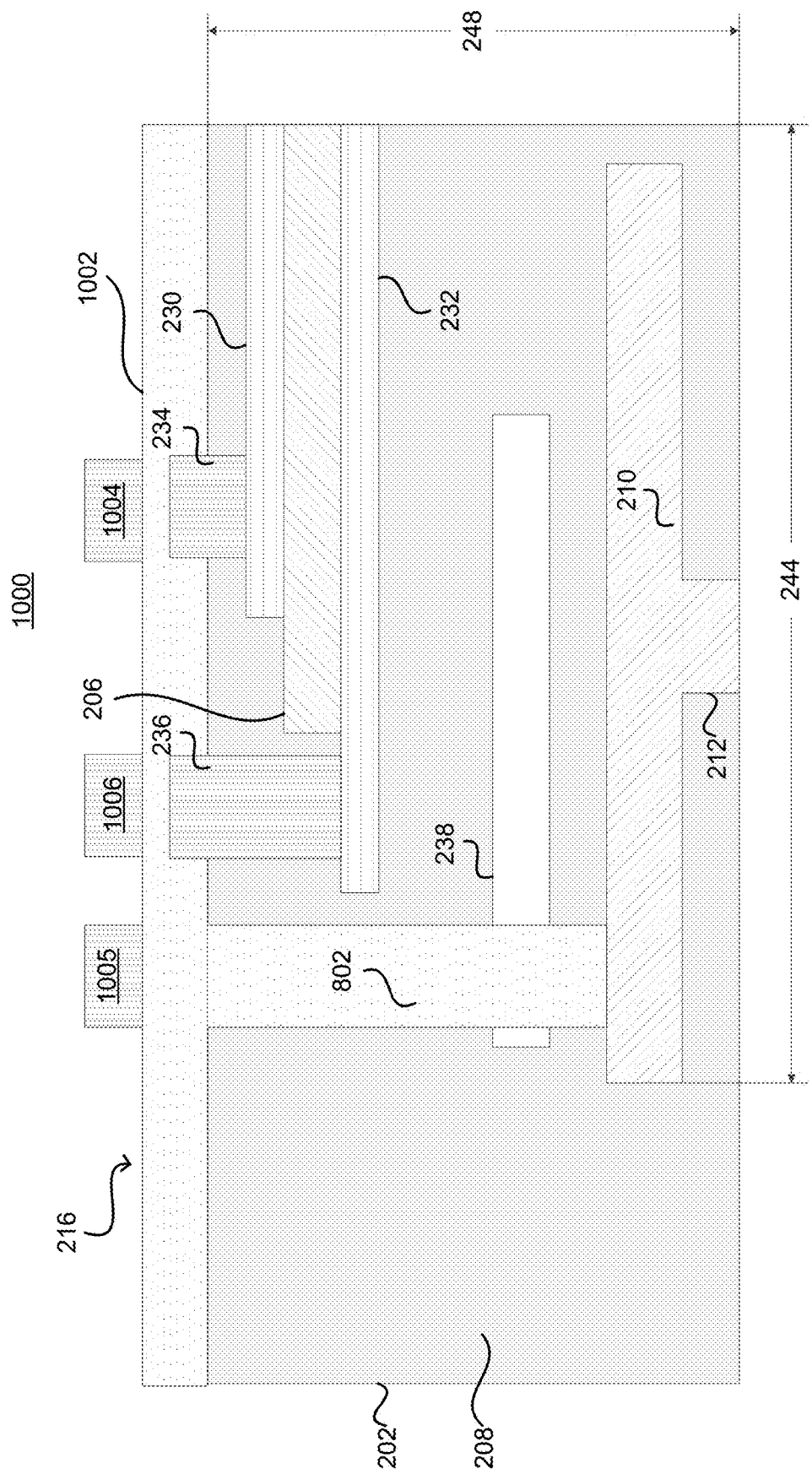
Figure 11:
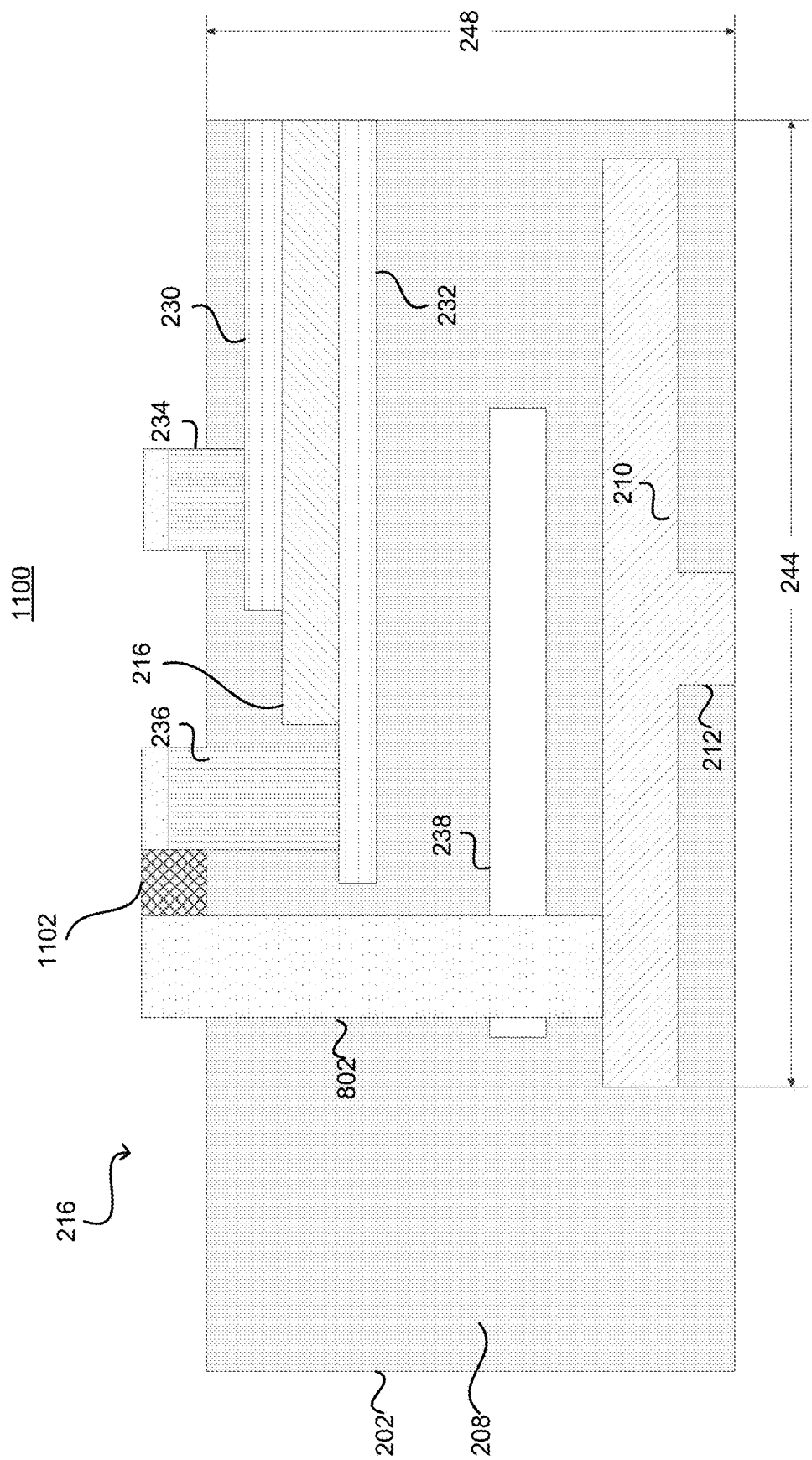

In FIG. 9, the sacrificial material 408 has been etched to form the cavity 238 using the release via 802. This evacuation can be accomplished through the use of vapor phase etching, such as XeF2 etching, for example. Vapor phase etching can aid in evacuating the sacrificial material 408 due to the possible extreme angle between the sacrificial material 408 and the release via 802 and because vapor phase etching can beneficially expand to fill the majority of the cavity 238. In FIG. 10, the photoresist layer 702 has been removed and a metalized layer 1002 has been applied to the top of the US transducer array 202 to form a conductive path through the via 802. Additionally, new photoresist masks 1004, 1005, and 1006 have been applied on top of the metalized layer 1002. Note that a singular photoresist mask can include portions (such as 1004, 1005, and 1006), but each of 1004, 1005, and 1006 are referenced individually for ease of understanding. In FIG. 11, the system 200 of FIG. 2 has been substantially formed including the dual-purpose via 240 of FIG. 2. The metalized layer 1002 has been etched away and the photoresist masks 1004, 1005, and 1006 removed.

Note that transducer vias 234 and 236 now comprise two separate metallic layers/components. Optionally, an electroless plating step can be used in order to fill in gaps in the vias 234, 236, and/or 240 resulting from sputter (or other) deposition techniques. The electroless plating step can therefore aid in creation of a more contiguous electrical path through a layer of the device. NiAu is one such suitable material for electroless plating. This step can aid in filling in vias such as dual-purpose via 240 as the metallization layer 1002 may form non-contiguous surface coating if metal sputter deposition is used. Additionally or alternatively, electrophoretic deposition can be used to seed a metal coating into vias 402, 404, and 802 prior to any metallization or electroless plating of the vias. Additional techniques can be used to fill in and/or plate a dual-purpose (or other) via to form an electrically conductive via (such as by filling the via with electrically conductive material to form a substantially columnar form of electrically conductive through a via.

Optionally mask segments 1005 and 1006 of FIG. 10 can be combined to form one unitary mask segment over both vias 236 and 802. If this optional step is performed, area 1102 can comprise an electrically conductive metallic material remaining from the metallic layer 1002. By adding this step, an electrically conductive path from the electrode 232 to the redistribution layer 210 can be formed.

Figure 12:
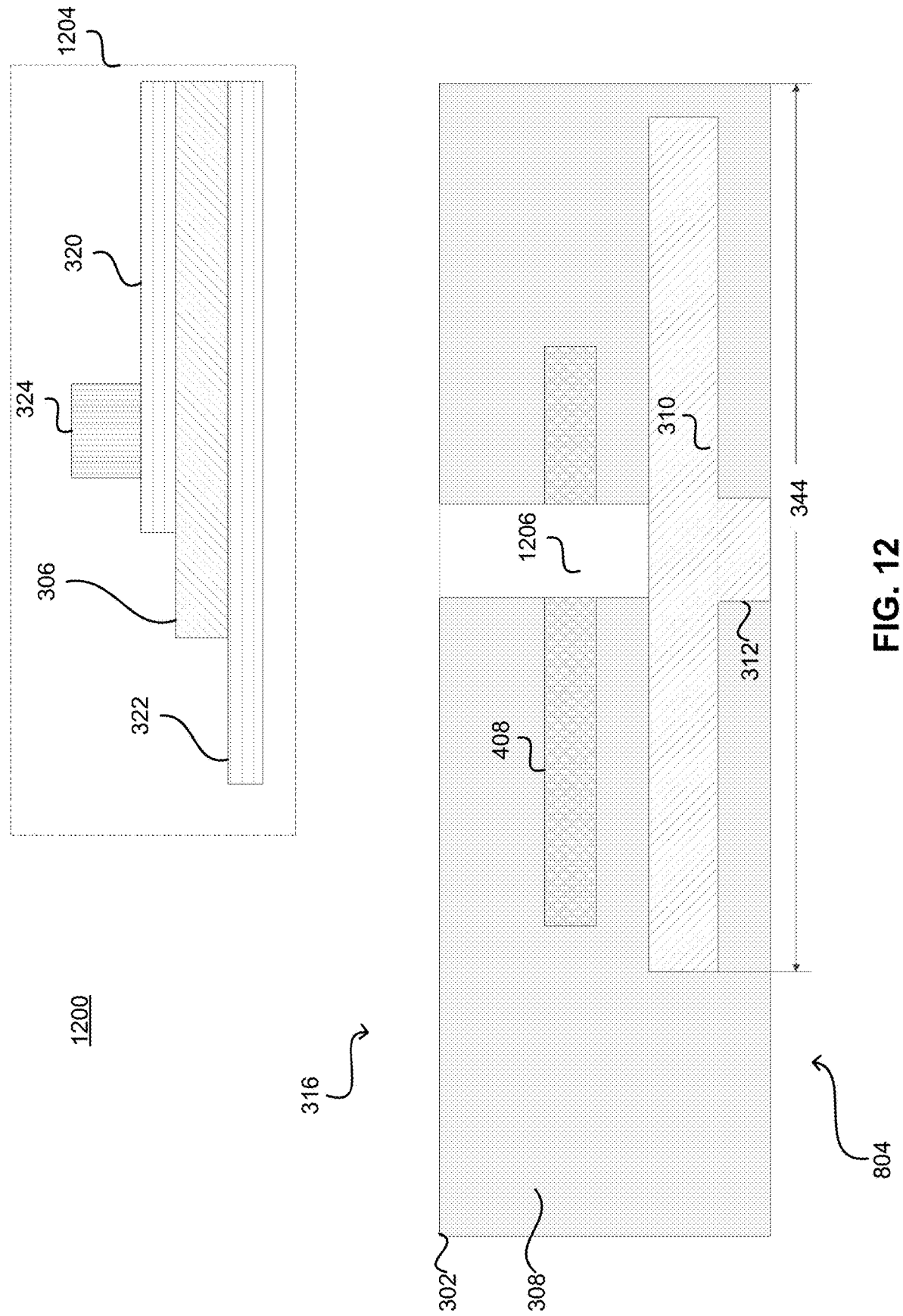
FIG. 12 illustrates a state of a MEMS ultrasonic array during a process for fabricating the system of FIG. 3 that embodies one or more features of the disclosure.

FIG. 12 illustrates an intermediary step that can be used to form the US array 302 of FIG. 3. Similar to the steps proceedings from FIG. 8-FIG. 11, a via 1206 can be etched through a dielectric layer 308 and optionally to the redistribution layer 310. However, in FIG. 12, this step is performed prior to additional layer deposition steps for the formation of the transducer cell 1204. By metallizing the via 1206, an electrically conductive path (not shown) can be formed through the dielectric layer 308 to the electrode 322 of the transducer cell 1204. In this manner, the finished US array can comprise a buried electrically conductive path through the dielectric layer 308 of the substrate.

As used herein, the terms electrically conductive and low impedance mean that the described element provides an electrical impedance lower than surrounding materials. For example, a low impedance or electrically conductive path between two components can indicate a metallic path through a dielectric that can provide an electrical pathway of less than two ohms of resistance. Alternatively, the pathway can provide less than one ohm of resistance or even less than one hundred milliohms of resistance.

As used herein, the term electrode means an electrical conductor used to make contact with a nonmetallic component. The term dielectric means an electrical insulator. The term substrate means a substance or layer that underlies something, or on which some process occurs, in particular.

Figure 13:
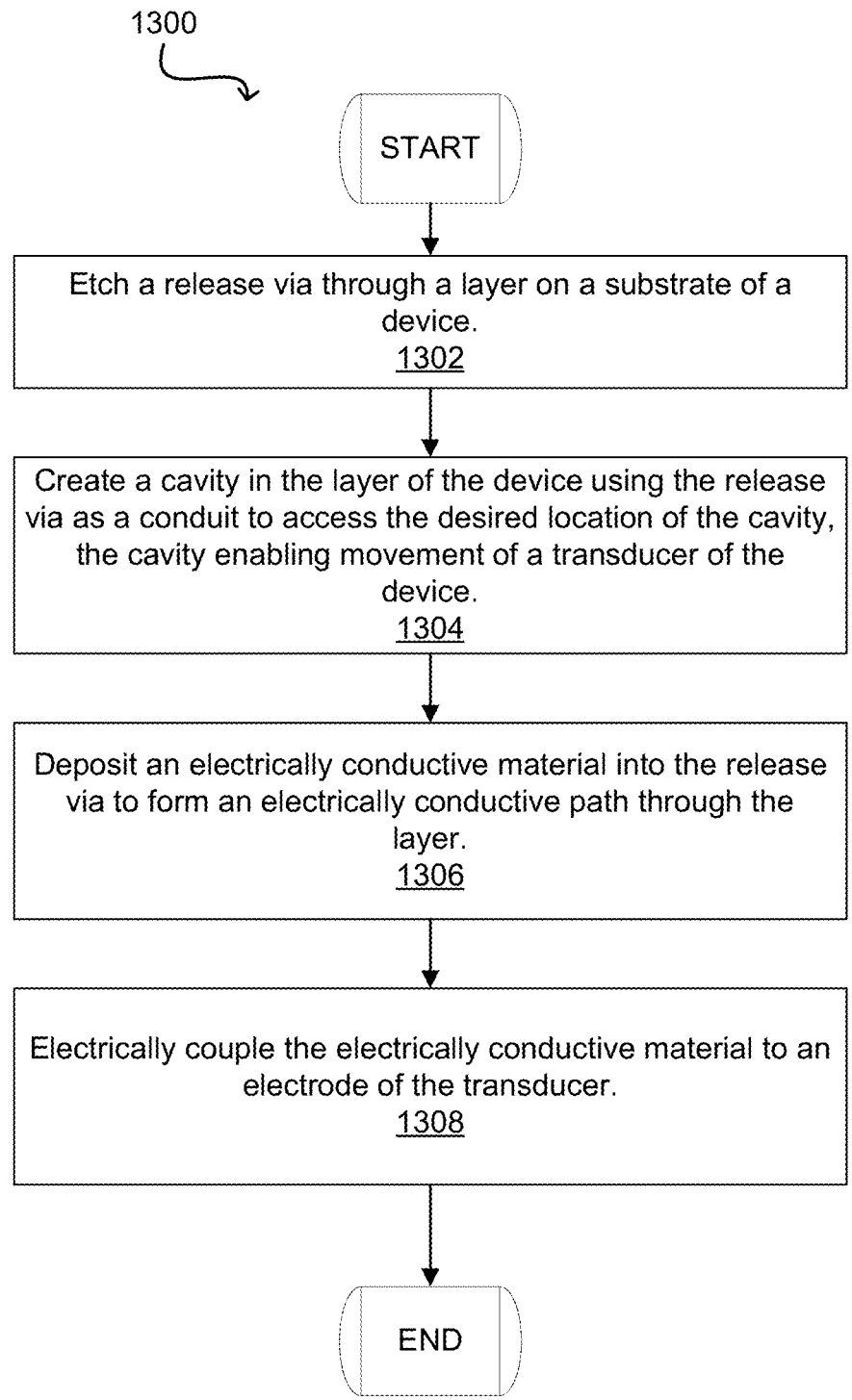
FIG. 13 illustrates a flowchart for manufacturing an ultrasonic array that embodies one or more features of the disclosure.

FIG. 13 illustrates a flowchart 1300 for manufacturing an ultrasonic array that embodies one or more features of the disclosure. At 1302, a release via can be etches through a layer of a device. For example, via 802 can be etches through dielectric layer 208. At 1304, a cavity can be created in the layer of the device using the release via as a conduit to access a desired location of the cavity, the cavity enabling movement of a transducer of the device. For example, via 802 can be used to access sacrificial material 408. Via 802 can also be used as a conduit to etch/evacuate sacrificial material 408 through use of a vapor phase etchant, for example. At 1306, an electrically conductive material can be deposited into the release via to form an electrically conductive path through the layer. For example, via 802 can be metallized by metallization layer 1002. At 1308, the electrically conductive material can be electrically coupled to an electrode of the transducer. For example, electrode 232 can be electrically coupled to metalized via 802.

Figure 14:
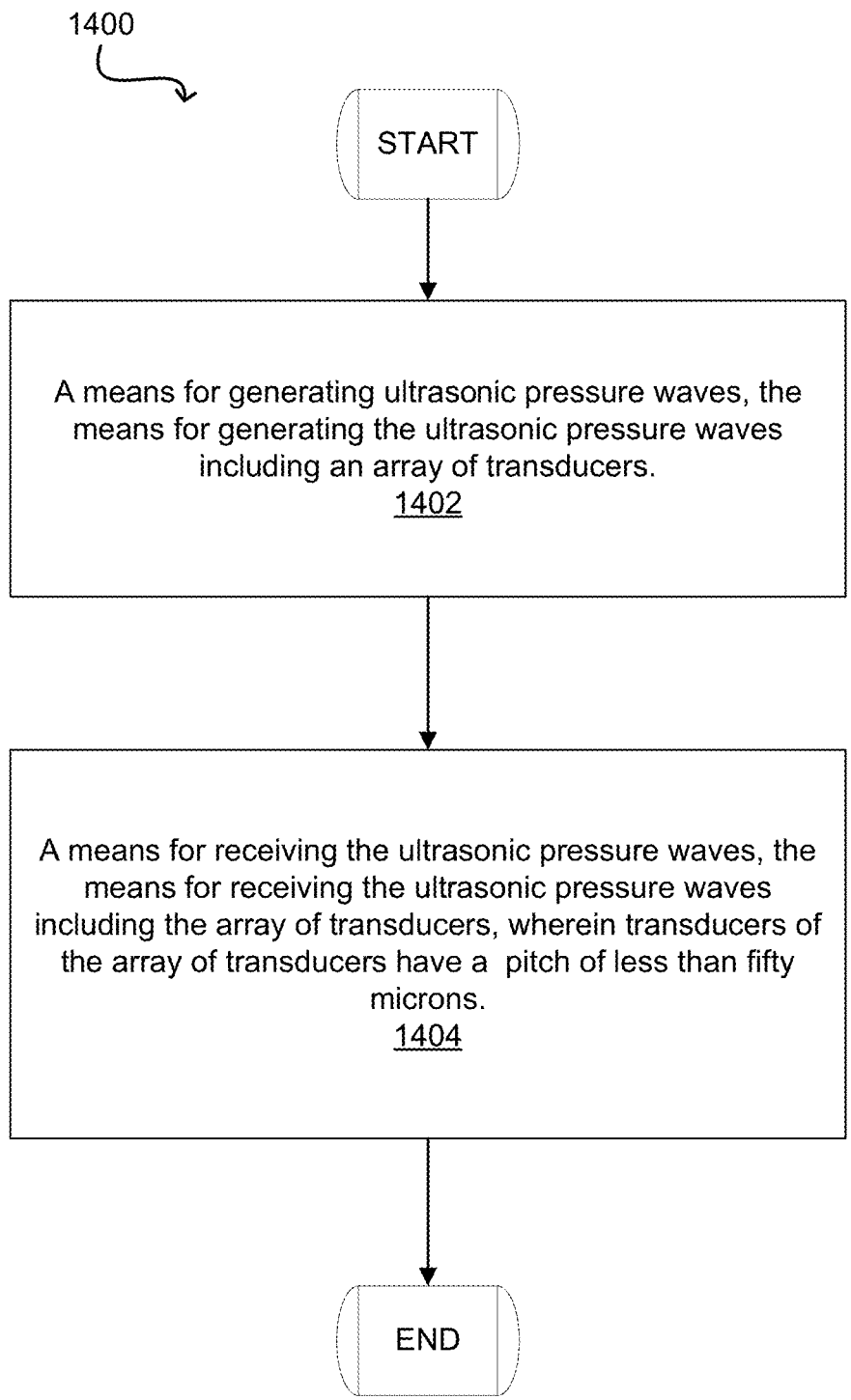
FIG. 14 illustrates a flowchart of an ultrasonic array that embodies one or more features of the disclosure.

FIG. 14 illustrates a flowchart 1400 of an ultrasonic array that embodies one or more features of the disclosure. At 1402 is a means for generating ultrasonic pressure waves, the means for generating the ultrasonic pressure waves including an array of transducers. For example US transducer array 202 can be used to generate ultrasonic pressure waves. At 1404 is a means for receiving the ultrasonic pressure waves, the means for receiving the ultrasonic pressure waves including the array of transducers, wherein transducers of the array of transducers have a pitch of less than fifty microns. For example, US transducer array 202 can be used to receive ultrasonic pressure waves.

Figure 15:
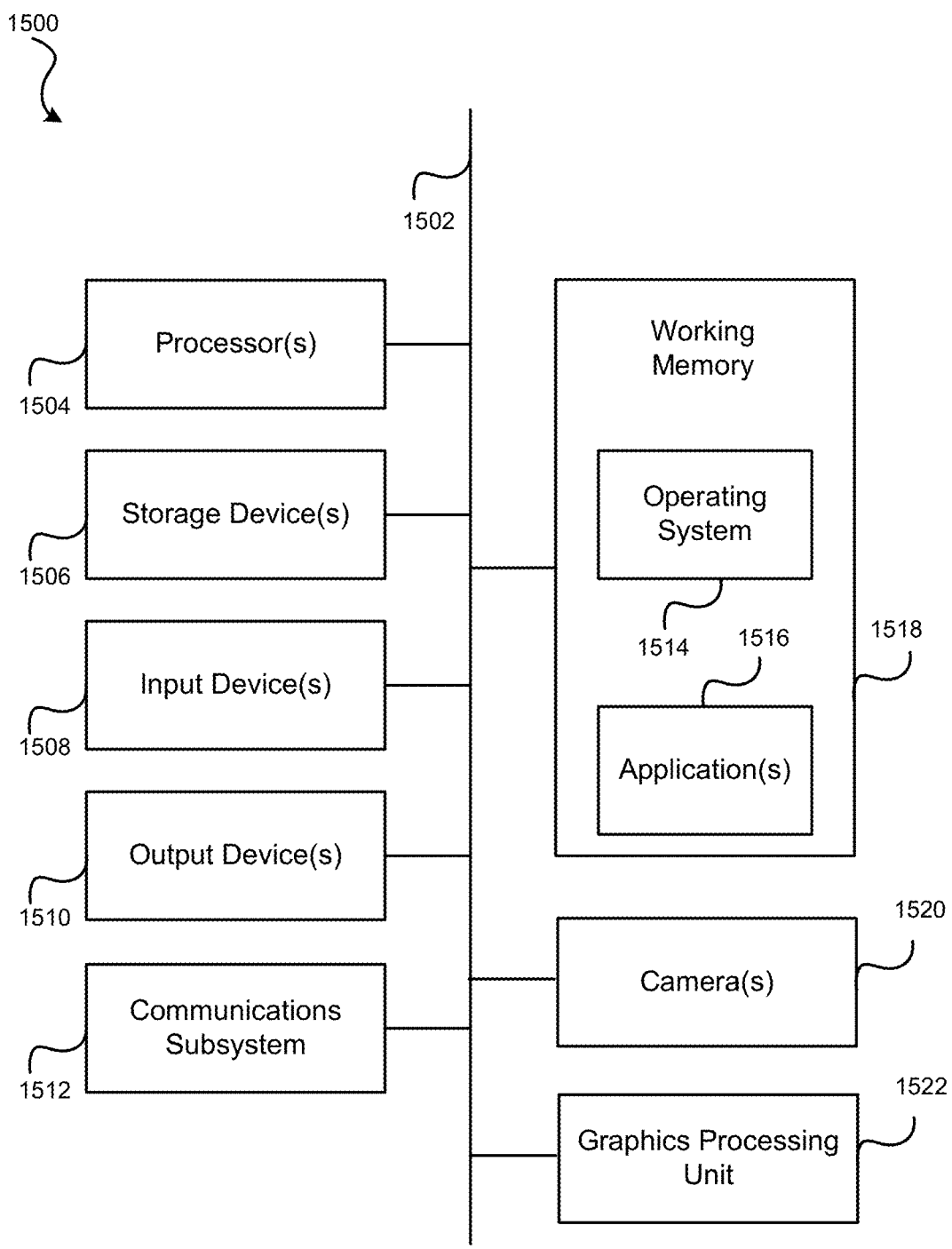
FIG. 15 illustrates an example of a computing system in which one or more embodiments may be implemented.

FIG. 15 illustrates an example of a computing system in which one or more embodiments may be implemented.

A computer system as illustrated in FIG. 15 may be incorporated as part of the above described computerized device. For example, computer system 1500 can represent some of the components of a television, a computing device, a server, a desktop, a workstation, a control or interaction system in an automobile, a tablet, a netbook or any other suitable computing system. A computing device may be any computing device with an image capture device or input sensory unit and a user output device. An image capture device or input sensory unit may be a camera device. A user output device may be a display unit. Examples of a computing device include but are not limited to video game consoles, tablets, smart phones and any other hand-held devices. FIG. 15 provides a schematic illustration of one implementation of a computer system 1500 that can perform the methods provided by various other implementations, as described herein, and/or can function as the host computer system, a remote kiosk/terminal, a point-of-sale device, a telephonic or navigation or multimedia interface in an automobile, a computing device, a set-top box, a table computer and/or a computer system. FIG. 15 is meant only to provide a generalized illustration of various components, any or all of which may be utilized as appropriate. FIG. 15, therefore, broadly illustrates how individual system elements may be implemented in a relatively separated or relatively more integrated manner.

The computer system 1500 is shown comprising hardware elements that can be electrically coupled via a bus 1502 (or may otherwise be in communication, as appropriate). The hardware elements may include one or more processors 1504, including without limitation one or more general-purpose processors and/or one or more special-purpose processors (such as digital signal processing chips, graphics processing units 1522, and/or the like); one or more input devices 1508, which can include without limitation one or more cameras, sensors, a mouse, a keyboard, a microphone configured to detect ultrasound or other sounds, and/or the like; and one or more output devices 1510, which can include without limitation a display unit such as the device used in implementations of the invention, a printer and/or the like. Additional cameras 1520 may be employed for detection of user's extremities and gestures. In some implementations, input devices 1508 may include one or more sensors such as infrared, depth, and/or ultrasound sensors. The graphics processing unit 1522 may be used to carry out the method for real-time wiping and replacement of objects described above.

In some implementations of the implementations of the invention, various input devices 1508 and output devices 1510 may be embedded into interfaces such as display devices, tables, floors, walls, and window screens. Furthermore, input devices 1508 and output devices 1510 coupled to the processors may form multi-dimensional tracking systems.

The computer system 1500 may further include (and/or be in communication with) one or more non-transitory storage devices 1506, which can comprise, without limitation, local and/or network accessible storage, and/or can include, without limitation, a disk drive, a drive array, an optical storage device, a solid-state storage device such as a random access memory ("RAM") and/or a read-only memory ("ROM"), which can be programmable, flash-updateable and/or the like. Such storage devices may be configured to implement any appropriate data storage, including without limitation, various file systems, database structures, and/or the like.

The computer system 1500 might also include a communications subsystem 1512, which can include without limitation a modem, a network card (wireless or wired), an infrared communication device, a wireless communication device and/or chipset (such as a Bluetooth device, an 802.11 device, a WiFi device, a WiMax device, cellular communication facilities, etc.), and/or the like. The communications subsystem 1512 may permit data to be exchanged with a network, other computer systems, and/or any other devices described herein. In many implementations, the computer system 1500 will further comprise a non-transitory working memory 1518, which can include a RAM or ROM device, as described above.

The computer system 1500 also can comprise software elements, shown as being currently located within the working memory 1518, including an operating system 1514, device drivers, executable libraries, and/or other code, such as one or more application programs 1516, which may comprise computer programs provided by various implementations, and/or may be designed to implement methods, and/or configure systems, provided by other implementations, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be stored on a computer-readable storage medium, such as the storage device(s) 1506 described above. In some cases, the storage medium might be incorporated within a computer system, such as computer system 1500. In other implementations, the storage medium might be separate from a computer system (e.g., a removable medium, such as a compact disc), and/or provided in an installation package, such that the storage medium can be used to program, configure and/or adapt a general purpose computer with the instructions/code stored thereon. These instructions might take the form of executable code, which may be executable by the computer system 1500 and/or might take the form of source and/or installable code, which, upon compilation and/or installation on the computer system 1500 (e.g., using any of a variety of generally available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed. In some implementations, one or more elements of the computer system 1500 may be omitted or may be implemented separate from the illustrated system. For example, the processor 1504 and/or other elements may be implemented separate from the input device 1508. In one implementation, the processor may be configured to receive images from one or more cameras that are separately implemented. In some implementations, elements in addition to those illustrated in FIG. 15 may be included in the computer system 1500.

Some implementations may employ a computer system (such as the computer system 1500) to perform methods in accordance with the disclosure. For example, some or all of the procedures of the described methods may be performed by the computer system 1500 in response to processor 1504 executing one or more sequences of one or more instructions (which might be incorporated into the operating system 1514 and/or other code, such as an application program 1516) contained in the working memory 1518. Such instructions may be read into the working memory 1518 from another computer-readable medium, such as one or more of the storage device(s) 1506. Merely by way of example, execution of the sequences of instructions contained in the working memory 1518 might cause the processor(s) 1504 to perform one or more procedures of the methods described herein.

The terms "machine-readable medium" and "computer-readable medium," as used herein, refer to any medium that participates in providing data that causes a machine to operate in a specific fashion. In some implementations implemented using the computer system 1500, various computer-readable media might be involved in providing instructions/code to processor(s) 1504 for execution and/or might be used to store and/or carry such instructions/code (e.g., as signals). In many implementations, a computer-readable medium may be a physical and/or tangible storage medium. Such a medium may take many forms, including but not limited to, non-volatile media, volatile media, and transmission media. Non-volatile media include, for example, optical and/or magnetic disks, such as the storage device(s) 1506. Volatile media include, without limitation, dynamic memory, such as the working memory 1518. Transmission media include, without limitation, coaxial cables, copper wire and fiber optics, including the wires that comprise the bus 1502, as well as the various components of the communications subsystem 1512 (and/or the media by which the communications subsystem 1512 provides communication with other devices). Hence, transmission media can also take the form of waves (including without limitation radio, acoustic and/or light waves, such as those generated during radio-wave and infrared data communications).

Common forms of physical and/or tangible computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, EPROM, a FLASH-EPROM, any other memory chip or cartridge, a carrier wave as described hereinafter, or any other medium from which a computer can read instructions and/or code.

Various forms of computer-readable media may be involved in carrying one or more sequences of one or more instructions to the processor(s) 1504 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 1500. These signals, which might be in the form of electromagnetic signals, acoustic signals, optical signals and/or the like, are all examples of carrier waves on which instructions can be encoded, in accordance with various implementations of the invention.

The communications subsystem 1512 (and/or components thereof) generally will receive the signals, and the bus 1502 then might carry the signals (and/or the data, instructions, etc. carried by the signals) to the working memory 1518, from which the processor(s) 1504 retrieves and executes the instructions. The instructions received by the working memory 1518 may optionally be stored on a non-transitory storage device 1506 either before or after execution by the processor(s) 1504.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Moreover, nothing disclosed herein is intended to be dedicated to the public.

What is claimed is:

1. A micro-electro-mechanical ultrasonic device, comprising:
    a layer;
    a transducer having at least one electrode, the transducer mechanically coupled to the layer, wherein the layer defines at least a portion of a cavity, the cavity configured to enable movement of the transducer; and
    a first electrically conductive via that traverses the cavity and at least a part of the layer to form a substantially linear electrically conductive path across the cavity and the at least a part of the layer, wherein the first electrically conductive via is electrically coupled to a first electrode of the at least one electrode of the transducer.

2. The device of claim 1, wherein the transducer is at least partially encapsulated by the layer.

3. The device of claim 1, wherein:
    the device further comprises a redistribution layer; and
    the first electrically conductive via is configured to provide an electrically conductive coupling between the redistribution layer and the first electrode of the transducer.

4. The device of claim 1, wherein:
    the device comprises a substantially planar side; and
    the substantially linear electrically conductive path of the first electrically conductive via is substantially orthogonal to the planar side.

5. The device of claim 1, wherein:
    the device comprises a planar side;
    the first electrically conductive via is characterized by a first dimension substantially orthogonal to the planar side and a second dimension substantially parallel to the planar side; and
    the first dimension is at least two times greater than the second dimension.

6. The device of claim 1, wherein the first electrically conductive via provides an electrically conductive coupling between two elements of the device on opposing sides of the transducer.

7. The device of claim 1, further comprising a second electrically conductive via; wherein the first electrode is further electrically coupled to the second electrically conductive via.

8. The device of claim 7, further comprising a third electrically conductive via electrically coupled to a second electrode of the transducer.

9. The device of claim 1, wherein the transducer comprises at least one of:
- a piezoelectric micro-machined ultrasonic transducer, a capacitive micro-machined ultrasonic transducer, or any combination thereof.

10. The device of claim 1, wherein the transducer is configured to:
- transmit ultrasonic pressure waves; and
- receive reflections of the transmitted ultrasonic pressure waves from a physical object.

11. The device of claim 10, wherein the first electrically conductive via electrically couples the transducer with a controller, the controller configured to induce the transducer to transmit the ultrasonic pressure waves and to receive the reflections of the transmitted ultrasonic pressure waves from the physical object.

12. The device of claim 1, wherein the layer is a first layer;
- wherein the device further comprises a second layer; and
- wherein the first electrically conductive via is electrically coupled to the second layer.

13. The device of claim 12, wherein the second layer comprises control circuits.

14. The device of claim 12, wherein the cavity is between the at least one electrode and the second layer.

* * * * *